(12) United States Patent
King et al.

(10) Patent No.: US 12,009,177 B2
(45) Date of Patent: Jun. 11, 2024

(54) DETECTION USING SEMICONDUCTOR DETECTOR

(71) Applicants: TAIWAN SEMICONDUCTOR MANUFACTURING COMPANY, LTD., Hsinchu (TW); NATIONAL TSING HUA UNIVERSITY, Hsinchu (TW)

(72) Inventors: Ya-Chin King, Taipei (TW); Chrong-Jung Lin, Hsinchu (TW); Burn-Jeng Lin, Hsinchu (TW); Chien-Ping Wang, Kaohsiung (TW); Shao-Hua Wang, Taoyuan (TW); Chun-Lin Chang, Hsinchu County (TW); Li-Jui Chen, Hsinchu (TW)

(73) Assignees: TAIWAN SEMICONDUCTOR MANUFACTURING COMPANY, LTD., Hsinchu (TW); NATIONAL TSING HUA UNIVERSITY, Hsinchu (TW)

( * ) Notice: Subject to any disclaimer, the term of this patent is extended or adjusted under 35 U.S.C. 154(b) by 654 days.

(21) Appl. No.: 17/171,939

(22) Filed: Feb. 9, 2021

(65) Prior Publication Data
US 2021/0407764 A1 Dec. 30, 2021

Related U.S. Application Data

(60) Provisional application No. 63/045,764, filed on Jun. 29, 2020.

(51) Int. Cl.
| | | |
|---|---|---|
| H01J 37/304 | (2006.01) | |
| G03F 7/00 | (2006.01) | |
| H01J 37/30 | (2006.01) | |
| H01L 27/144 | (2006.01) | |
| H01L 31/02 | (2006.01) | |
| H01L 31/113 | (2006.01) | |
| H01L 31/18 | (2006.01) | |

(Continued)

(52) U.S. Cl.
CPC ........ *H01J 37/304* (2013.01); *G03F 7/70516* (2013.01); *G03F 7/7055* (2013.01);
(Continued)

(58) Field of Classification Search
CPC . H01J 37/304; H01J 37/3002; G03F 7/70516; G03F 7/7055; G03F 7/70616;
(Continued)

(56) References Cited

U.S. PATENT DOCUMENTS 8,764,995 B2 7/2014 Chuang
8,796,666 B1 8/2014 Huang
(Continued)

*Primary Examiner* — David E Smith
(74) *Attorney, Agent, or Firm* — Maschoff Brennan

(57) ABSTRACT

A method includes applying a first voltage to a source of a first transistor of a detector unit of a semiconductor detector in a test wafer and applying a second voltage to a gate of the first transistor and a drain of a second transistor of the detector unit. The first transistor is coupled to the second transistor in series, and the first voltage is higher than the second voltage. A pre-exposure reading operation is performed to the detector unit. Light of an exposure apparatus is illuminated to a gate of the second transistor after applying the first and second voltages. A post-exposure reading operation is performed to the detector unit. Data of the pre-exposure reading operation is compared with the post-exposure reading operation. An intensity of the light is adjusted based on the compared data of the pre-exposure reading operation and the post-exposure reading operation.

20 Claims, 19 Drawing Sheets

(52) U.S. Cl.
CPC ...... *G03F 7/70616* (2013.01); *H01J 37/3002* (2013.01); *H01L 27/1446* (2013.01); *H01L 31/02005* (2013.01); *H01L 31/1136* (2013.01); *H01L 31/18* (2013.01)

(58) Field of Classification Search
CPC .......................... H01L 31/18; H01L 31/02005; H01L 27/1446
See application file for complete search history.

(56) References Cited

U.S. PATENT DOCUMENTS

| | | |
|---|---|---|
| 8,828,625 B2 | 9/2014 | Lu |
| 8,841,047 B2 | 9/2014 | Yu |
| 8,877,409 B2 | 11/2014 | Hsu |
| 8,945,803 B2 | 2/2015 | Chen |
| 8,987,689 B2 | 3/2015 | Chen |
| 9,093,530 B2 | 4/2015 | Huang |
| 9,184,054 B1 | 11/2015 | Huang |
| 9,256,123 B2 | 2/2016 | Shih |
| 9,269,537 B2 | 2/2016 | Tseng |
| 9,305,799 B2 | 4/2016 | Chen |
| 9,336,993 B2 | 5/2016 | Yu |
| 9,367,661 B2 | 6/2016 | Jou |
| 9,529,268 B2 | 12/2016 | Chuang |
| 9,529,959 B2 | 12/2016 | Wang |
| 9,548,303 B2 | 1/2017 | Lee |
| 2008/0237586 A1* | 10/2008 | Sun .................... H01L 22/32 438/18 |
| 2016/0284759 A1* | 9/2016 | Kimura ............ H01L 27/14643 |
| 2021/0185260 A1* | 6/2021 | Huang .................. H04N 25/75 |

* cited by examiner

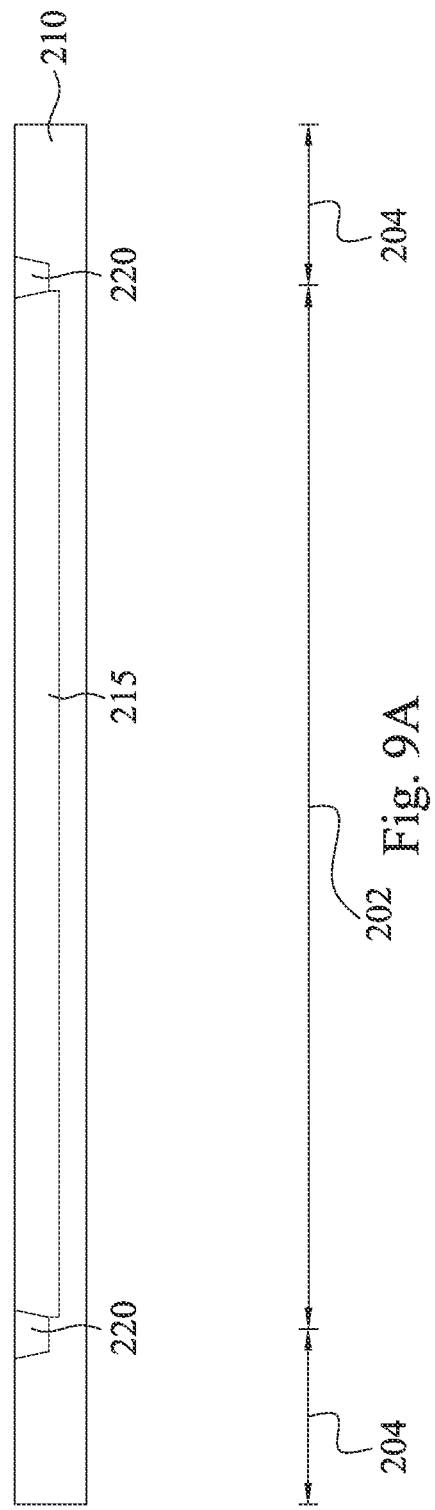

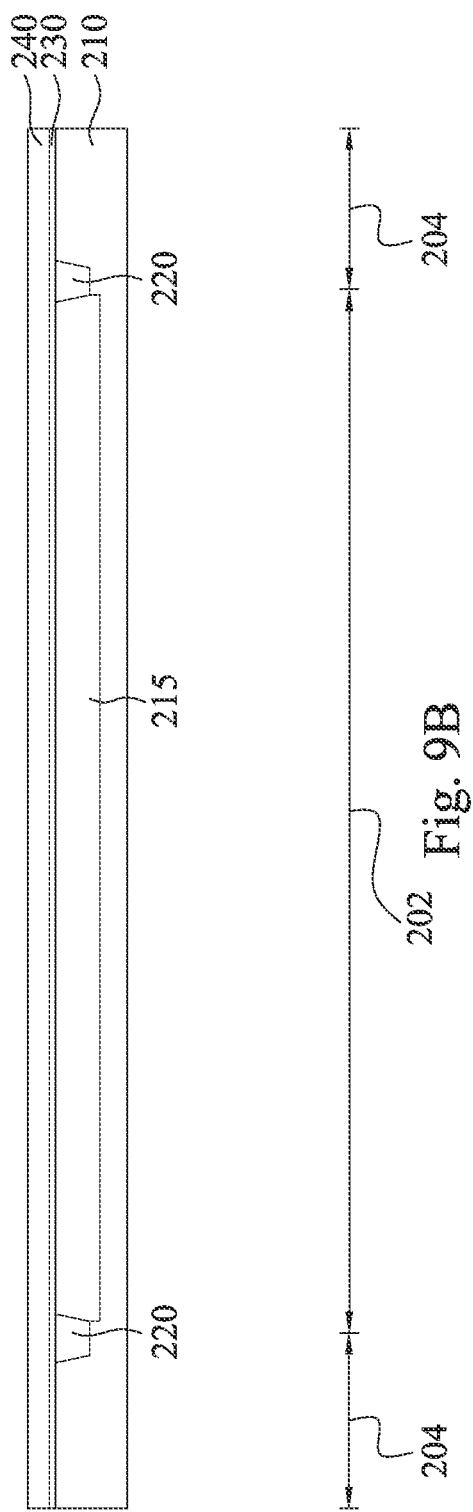

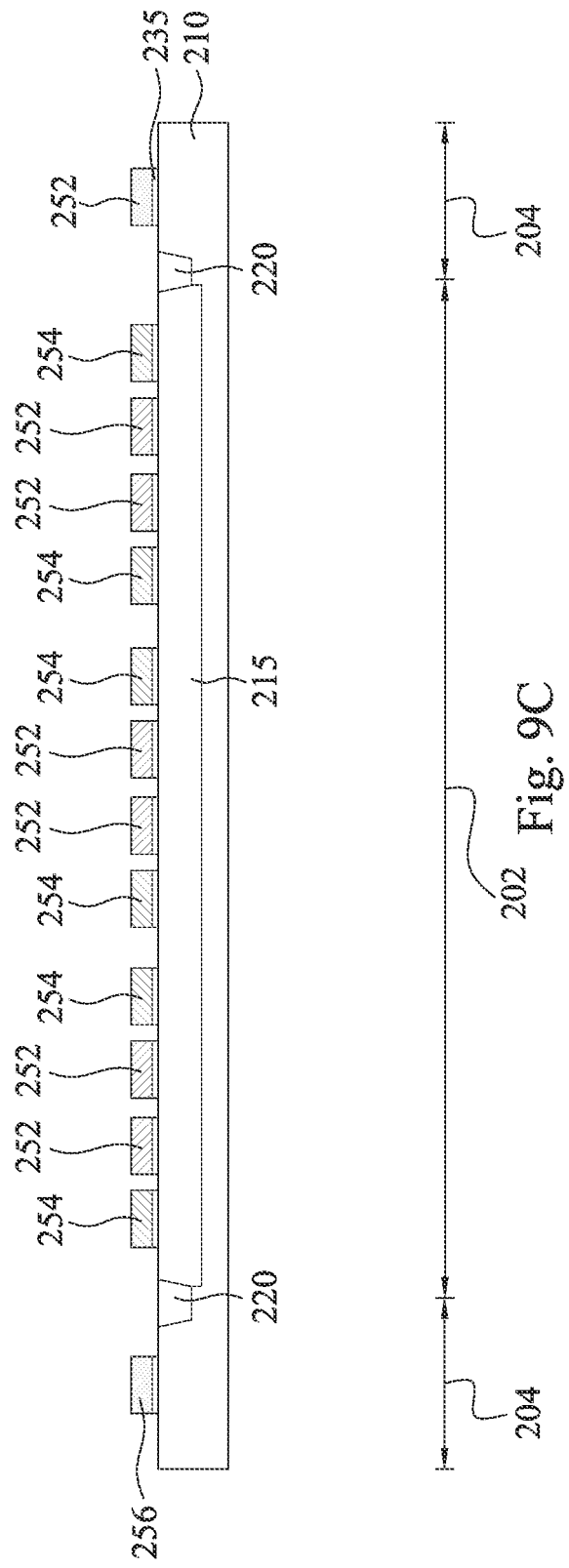

A

600

600

DETECTION USING SEMICONDUCTOR DETECTOR

PRIORITY CLAIM AND CROSS-REFERENCE

This application claims priority to U.S. Provisional Application Ser. No. 63/045,764, filed Jun. 29, 2020, which is herein incorporated by reference.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

As the size has decreased, maintaining the reliability in patterning processes and the yields produced by the patterning processes has become more difficult. In some cases, the use of optical proximity correction and the adjustment of lithography parameters such as the duration of a process, the wavelength, focus, and intensity of light used can mitigate some defects. However, the current and systems for patterning material layers in semiconductor wafers has not been entirely satisfactory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A-9H illustrate a method for manufacturing a semiconductor structure in different stages in accordance with some embodiments.

DETAILED DESCRIPTION

Figure 1:
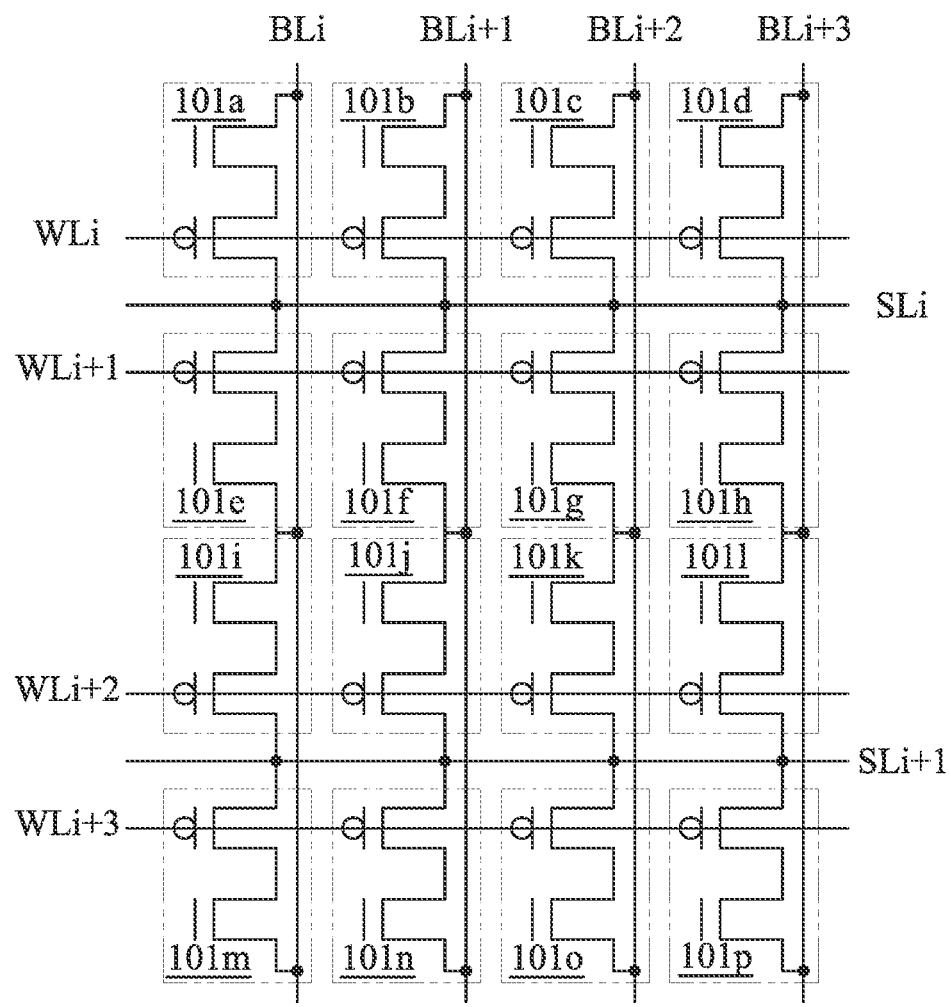
FIG. 1 is a schematic drawing illustrating a semiconductor detector according to some embodiments of the present disclosure.
Figure 1:
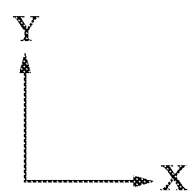

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

The present disclosure is related to semiconductor detectors and methods of forming the same. More particularly, some embodiments of the present disclosure are related to high-density and powerless semiconductor detectors for extreme ultraviolet (EUV), deep ultraviolet (DUV), and/or e-beam lights. In some embodiments, the semiconductor detectors may be realized on the device including planar devices, multi-gate devices, FinFETs, nanosheet-gate FETs, and gate-all-around FETs.

FIG. 1 is a schematic drawing illustrating a semiconductor detector 100 according to some embodiments of the present disclosure. In FIG. 1, the semiconductor detector 100 includes a plurality of detector units 101a, 101b, 101c, 101d, 101e, 101f, 101g, 101h, 101i, 101j, 101k, 101l, 101m, 101n, 101o, and 101p, each of which includes two transistors, for detecting light intensity. Each of the detector units 101a-101p may be coupled with one of word lines WLi, WLi+1, WLi+2, and WLi+3, one of bit lines BLi, BLi+1, BLi+2, and BLi+3, and one of source lines SLi and SLi+1. For example, the detector unit 101a may be coupled with the word line WLi, the bit line BLi, and the source line SLi. The detector unit 101b may be coupled with the word line WLi, the bit line BLi+1, and the source line SLi. The detector unit 101c may be coupled with the word line WLi, the bit line BLi+2, and the source line SLi. The detector unit 101d may be coupled with the word line WLi, the bit line BLi+3, and the source line SLi. The detector unit 101e may be coupled with the word line WLi+1, the bit line BLi, and the source line SLi. The detector unit 101f may be coupled with the word line WLi+1, the bit line BLi+1, and the source line SLi. The detector unit 101g may be coupled with the word line WLi+1, the bit line BLi+2, and the source line SLi. The detector unit 101h may be coupled with the word line WLi+1, the bit line BLi+3, and the source line SLi. The detector unit 101i may be coupled with the word line WLi+2, the bit line BLi, and the source line SLi+1. The detector unit 101j may be coupled with the word line WLi+2, the bit line BLi+1, and the source line SLi+1. The detector unit 101k may be coupled with the word line WLi+2, the bit line BLi+2, and the source line SLi+1. The detector unit 101l may be coupled with the word line WLi+2, the bit line BLi+3, and the source line SLi+1. The detector unit 101m may be coupled with the word line WLi+3, the bit line BLi, and the source line SLi+1. The detector unit 101n may be coupled with the word line WLi+3, the bit line BLi+1, and the source line SLi+1. The detector unit 101o may be coupled with the word line WLi+3, the bit line BLi+2, and the source line SLi+1. The detector unit 101p may be coupled with the word line WLi+3, the bit line BLi+3, and the source line SLi+1. It is noted that though merely some detector units 101a-101p are depicted, other detector units (not shown) can be coupled with the plurality of lines (word lines, bit lines, and/or source lines) of the semiconductor detector 100. A portion of the semiconductor detector 100 may have 2 or more columns that can be arranged in both X-axial and Y-axial directions.

The word lines WLi-WLi+3 are responsible for unit selection, the bit lines BLi-BLi+3 and the source lines SLi-SLi+1 are responsible for data readout. In FIG. 1, the word lines WLi-WLi+3 and the source lines SLi-SLi+1 may extend substantially in the same direction. For example, the word lines WLi-WLi+3 and the source lines SLi-SLi+1 extend substantially in X-axial direction. Further, the bit lines BLi-BLi+3 extend substantially in Y-axial direction. Stated another way, the word lines WLi-WLi+3 (the source lines SLi-SLi+1) and the bit lines BLi-BLi+3 extend in different directions. For example, the word lines WLi-WLi+3 (the source lines SLi-SLi+1) are substantially perpendicular to the bit lines BLi-BLi+3.

In some embodiments, all of the detector units 101a-101p have a substantially identical structure but different orientations. In greater detail, the detector units 101a-101d and the detector units 101e-101h are symmetric relative to the illustrated X axis, the detector units 101e-101h and the detector units 101i-101l are symmetric relative to the illustrated X axis, and the detector units 101i-101l and the detector units 101m-101p are symmetric relative to the illustrated X axis. The detector units 101a and 101e as a group may be reproduced and allocated as a plurality of rows and columns to form a detector unit array. With such configuration, the detector units 101a-101h share the same source line (i.e., the source line SLi), and the detector units 101i-101p share the same source line (i.e., the source line SLi+1).

Figure 2:
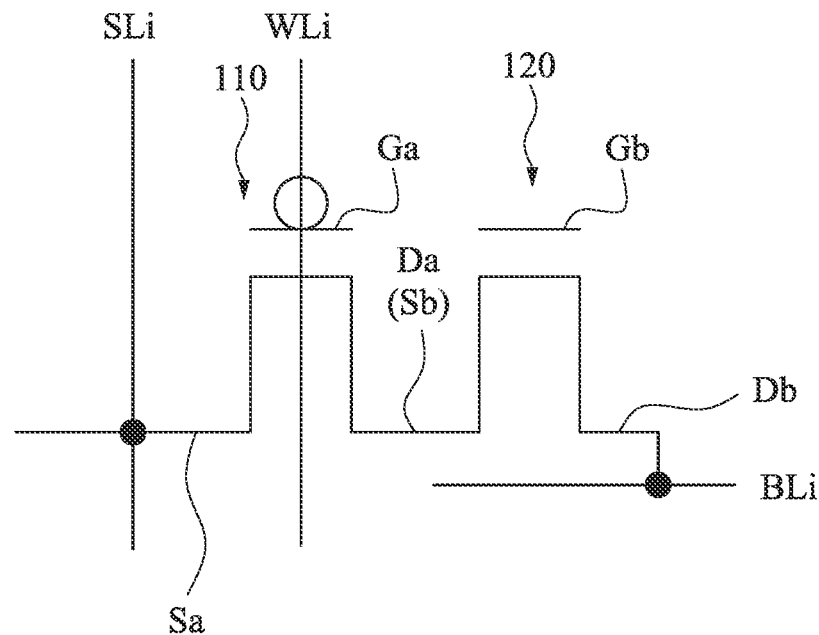
FIG. 2 is an enlarged view of the detector unit in FIG. 1.

FIG. 2 is an enlarged view of the detector unit 101a in FIG. 1. Reference is made to FIGS. 1 and 2. Each of the detector units 101a-101p includes a first transistor 110 and a second transistor 120. The first transistor 110 and the second transistor 120 have the same conductivity type, e.g., p-type. The first transistor 110 and the second transistor 120 are connected/coupled in series. Specifically, a source Sa of the first transistor 110 is coupled to one of the source lines (i.e., the source line SLi in this detector unit 101a), a gate Ga of the first transistor 110 is coupled to one of the word lines (i.e., the word line WLi in this detector unit 101a), and a drain Da of the first transistor 110 is coupled to the source Sb of the second transistor 120. A gate Gb of the second transistor 120 is a floating gate and configured to store electrons for light detection, and a drain Db of the second transistor 120 is coupled to one of the bit lines (i.e., the bit line BLi in this detector unit 101a). The gate Gb of the second transistor 120 serves as a signal storage node, which stores electrical charge at a level correlated to the light/e-beam intensity.

Figure 3:
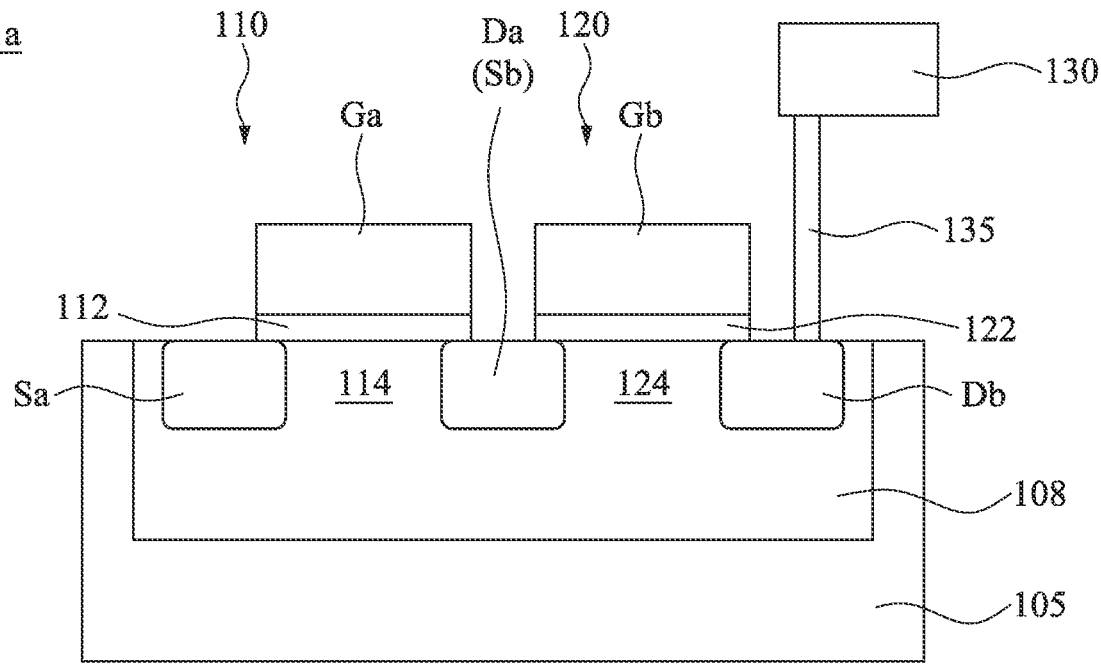
FIG. 3 is a schematic cross-sectional view of the detector unit in FIG. 2, in accordance with some embodiments.

FIG. 3 is a schematic cross-sectional view of the detector unit 101a in FIG. 2, in accordance with some embodiments. The detector unit 101a includes a substrate 105, the first transistor 110, and the second transistor 120. The first transistor 110 and the second transistor 120 are on the substrate 105. In some embodiments, the substrate 105 is a p-type semiconductor substrate (p-substrate). For example, p-type dopants, e.g., boron, boron difluoride ($BF_2$), or other suitable materials, are introduced into the substrate 105 to form the p-substrate. In some embodiments, the substrate 105 has a well region 108 therein. The well region 108 may be a doping region and has dopants therein. For example, the well region 108 is a p-well, an n-well, or combination thereof. In the case of FIG. 3, the well region 108 is an n-well and includes n-type dopants, e.g., arsenic, phosphorus, or other suitable materials, therein. In some embodiments, the substrate 105 and the well region 108 have opposite conductivity types. For example, the substrate 105 is p-type, and the well region 108 is n-type. A dopant concentration of the well region 108 is greater than a dopant concentration of the substrate 105.

The first transistor 110 and the second transistor 120 are above the well region 108. Source/drain regions of the first transistor 110 and the second transistor 120 are in the well regions 108. For example, the source Sa of the first transistor 110, the drain Da of the first transistor 110 (i.e., the source Sb of the second transistor 120), and the drain Db of the second transistor 120 are in the well regions 108 and are doping regions. In the case of FIG. 3, the source Sa and the drains Da and Db include p-type dopants, e.g., boron, boron difluoride ($BF_2$), or other suitable materials, therein. In some embodiments, the source Sa, the drains Da and Db, and the substrate 105 have the same conductivity type. That is, the source Sa and the drains Da and Db have a conductivity type opposite to that of the well region 108. A dopant concentration of each of the source Sa and the drains Da and Db is greater than a dopant concentration of the well regions 108. In some other embodiments, the source/drain regions (e.g., the source Sa and the drain Da) are epitaxial structures grown in recesses of the substrate 105, and the source/drain regions have a material different from that of the substrate 105.

The gate Ga of the first transistor 110 is above the well region 108 and between the source Sa and the drain Da. An interfacial layer 112 is between the gate Ga and the well region 108. A region in the well region 108, between the source Sa and the drain Da, and right under the gate Ga is a channel 114 of the first transistor 110. The gate Gb of the second transistor 120 is above the well region 108 and between the source Sb and the drain Db. Another interfacial layer 122 is between the gate Gb and the well region 108. A region in the well region 108, between the source Sb and the drain Db, and right under the gate Gb is a channel 124 of the second transistor 120. The channels 114 and 124 are P-type in FIG. 3, if the sources Sa, Sb and drains Da, Db are P-type.

In some embodiments, the sources Sa of the first transistors 110 of adjacent detector units (e.g., the detector units 101a-101h in FIG. 1) are connected/coupled to each other and form the source lines (e.g., the source line SLi in FIG. 1). The drains Da of the first transistors 110 of the detector units 101a-101p (see FIG. 1) are spaced apart from each other. In some embodiments, the gates Ga of the first transistors 110 of adjacent detector units (e.g., the detector units 101a-101d in FIG. 1) are connected/coupled to each other and form the word lines (e.g., the word line WLi in FIG. 1). In some embodiments, a conductive line 130 is connected/coupled to the drains Db of the second transistors 120 of adjacent detector units (e.g., the detector units 101a-101d in FIG. 1) through vias 135 and serves as a bit line (e.g., the bit line BLi in FIG. 1). The gates Gb of the second transistors 120 of the detector units 101a-101p (see FIG. 1) are spaced apart from each other, such that each of the gates Gb can individually detect/sense light/e-beam intensity at different positions.

Figure 4:
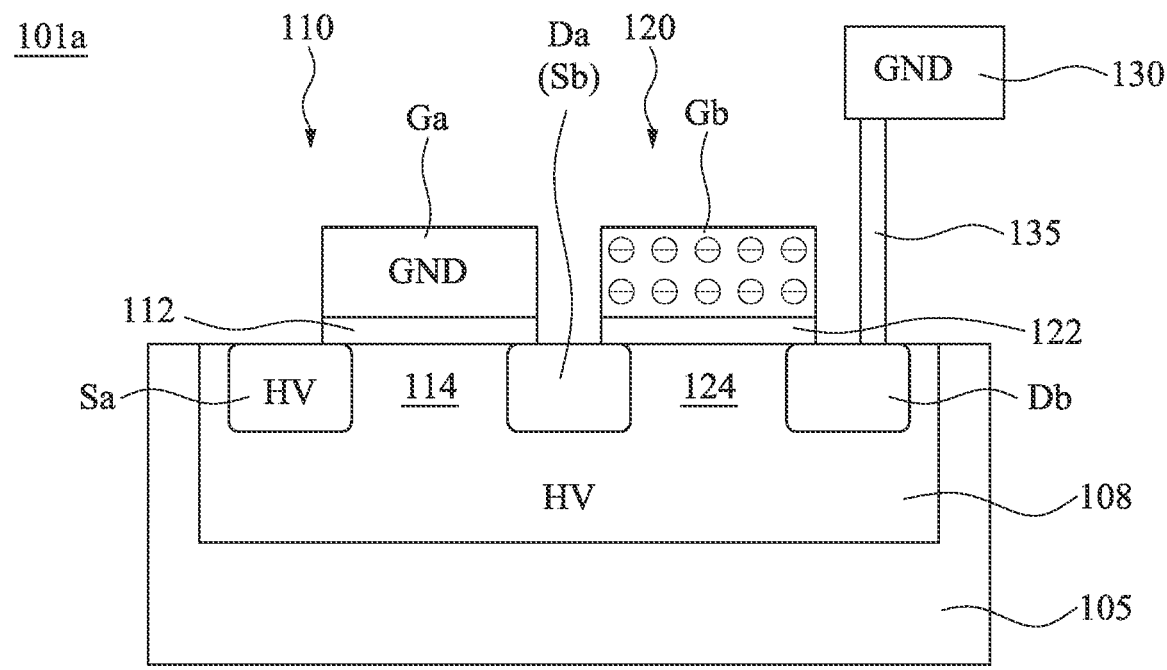
FIG. 4 is a schematic cross-sectional view illustrating an exemplary detector unit at an initialization operation according to some embodiments of the present disclosure.

FIG. 4 is a schematic cross-sectional view illustrating an exemplary detector unit 101a at an initialization operation according to some embodiments of the present disclosure. Reference is made to FIGS. 3 and 4. In greater detail, each of the detector units 101a-101p (see FIG. 1) has at least three different states/modes it can be in: initialization where the unit is initialized, reading when the data has been requested, and detecting when light/e-beam intensity is detected. The detector unit (here use the detector unit 101a as an example) performs the three different states (initialization, read, detect) as follows:

Initialization—The start of an initialization cycle of the detector unit 101a begins by applying high voltages HV to the source Sa of the first transistor 110 (i.e., the source line SLi) and the well region 108, and the gate Ga of the first transistor 110 (i.e., the word line WLi) and the drain Db of the second transistor 120 (i.e., the bit line BLi) are charged to about 0V (i.e., ground (GND)). A channel hot hole induced hot electron injection (CHHIHEL) effect occurs and electrons are injected into the gate Gb of the second transistor 120 (i.e., the floating gate). The electrons in the gate Gb of the second transistor 120 will be used to detect/sense light/e-beam intensity in the detecting cycle, which will be discussed in greater detail below. The high voltage HV has a voltage higher than the ground voltage. In some embodiments, the high voltage HV is in a range of about 2*VDD to about 4*VDD. If the high voltage HV is lower than about 2*VDD, the amount of electrons in the gate Gb of the second transistor 120 may be not enough to detect the light intensity, or the sensitivity of the detector unit 101a is low. If the high voltage HV is higher than about 4*VDD, the detector unit 101a may be damaged.

Figure 5A:
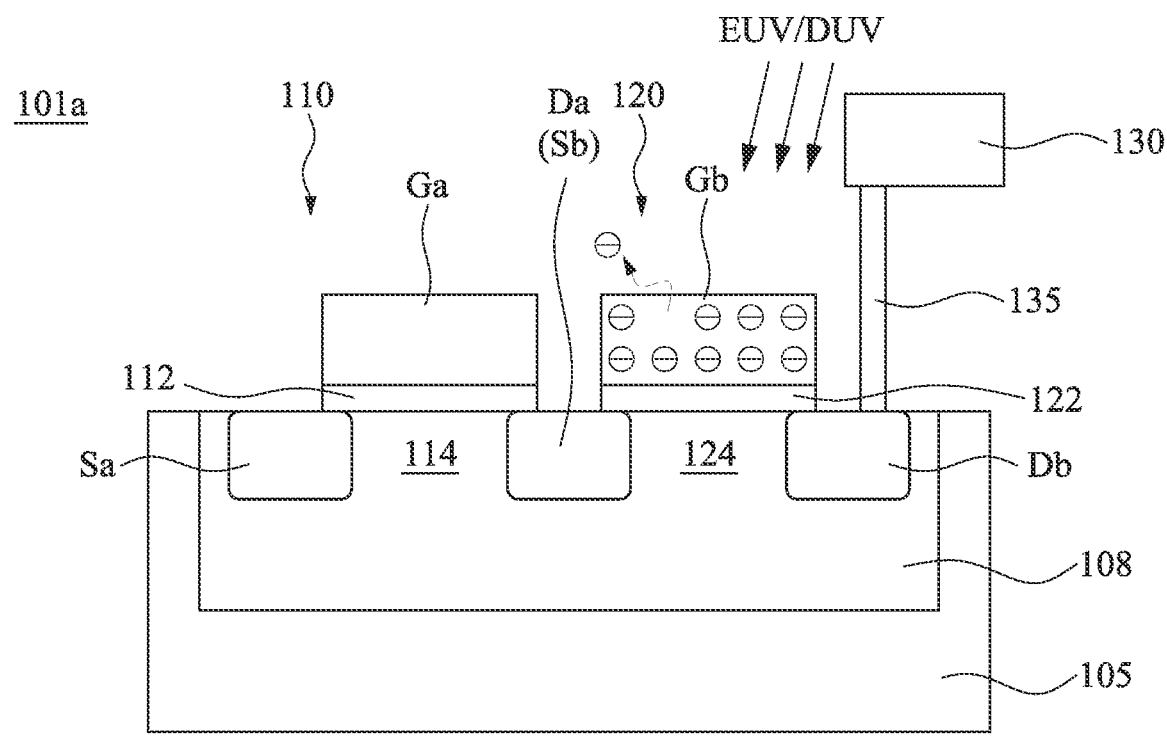
FIG. 5A is a schematic cross-sectional view illustrating an exemplary detector unit at a detecting operation for EUV/DUV light according to some embodiments of the present disclosure.

Detecting EUV/DUV light intensity—FIG. 5A is a schematic cross-sectional view illustrating an exemplary detector unit 101a at a detecting operation for EUV/DUV light according to some embodiments of the present disclosure. When the detector unit 101a is in the detecting mode, the gate Gb of the second transistor 120 is initialized to store electrons, and no power is applied to the gate Ga, the source Sa, Sb, the drain Db, and the well region 108. In other word, the detector unit 101a is powerless in the detecting mode. When the EUV or DUV light impact the detector unit 101a, electrons stored in the gate Gb of the second transistor 120 absorb the energy of light and escape from the gate Gb. The amount of escaped electrons is proportional to the light intensity and/or exposure time. Thus, the amount of electrons remaining in the gate Gb of the second transistor 120 may be reduced after EUV/DUV exposed thereon. In this way, the received EUV/DUV light intensity can be determined based on the decreasing of electrons in the gate Gb. If decreasing of electrons in the gate Gb is lower than expected (e.g., lower than a predetermined threshold), it means that the received EUV/DUV light intensity may be insufficient. Then the EUV/DUV light source can be adjusted to increase the EUV/DUV light intensity. On the other hand, if decreasing of electrons in the gate Gb is higher than expected, it means that the received EUV/DUV light intensity may be excessively high. Then the EUV/DUV light source can be adjusted to decrease the EUV/DUV light intensity.

Figure 5B:
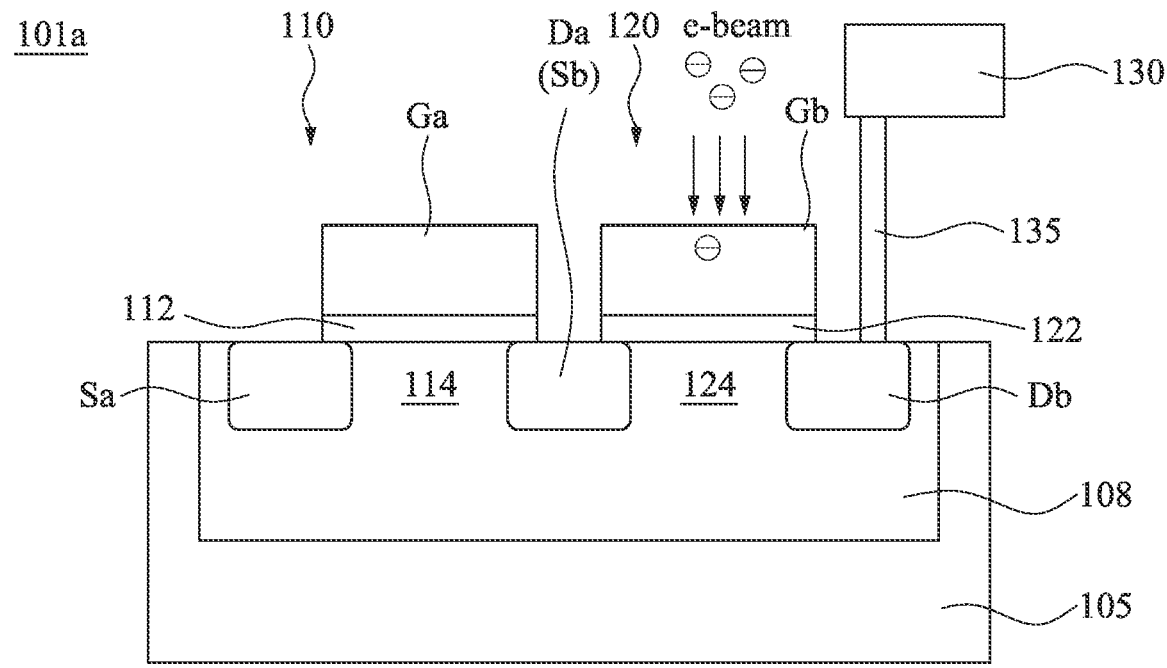
FIG. 5B is a schematic cross-sectional view illustrating an exemplary detector unit at a detecting operation for e-beam according to some embodiments of the present disclosure.

Detecting e-beam intensity—FIG. 5B is a schematic cross-sectional view illustrating an exemplary detector unit 101a at a detecting operation for e-beam according to some embodiments of the present disclosure. When the detector unit 101a is in the detecting mode, the gate Gb of the second transistor 120 is initialized to be neutral (i.e., free from electrons), substantially neutral (i.e., substantially free from electrons), or in a non-saturation state, and no power is applied to the gate Ga, the source Sa, Sb, the drain Db, and the well region 108. In other word, the detector unit 101a is powerless in the detecting mode. It is noted that the "non-saturation state" herein means that the amount of electrons in the gate Gb is not saturated, and electrons can still enter the gate Gb when the e-beam impact to the detector unit 101a. In contrast, the term of "saturation state" herein means that the amount of electrons in the gate Gb is full, and electrons can not enter the gate Gb when the e-beam impact to the detector unit 101a. When the e-beam impact to the detector unit 101a, electrons of the e-beams may enter the gate Gb of the second transistor 120. The amount of electrons in the gate Gb of the second transistor 120 is proportional to the e-beam intensity and/or exposure time. Thus, the amount of electrons remaining in the gate Gb of the second transistor 120 may be increased after e-beam impinges thereon. In this way, the received e-beam intensity can be determined based on the increasing of electrons in the gate Gb. If increasing of electrons in the gate Gb is lower than expected, it means that the received e-beam intensity may be insufficient. Then the e-beam source can be adjusted to increase the e-beam intensity. On the other hand, if increasing of electrons in the gate Gb is higher than expected, it means that the received e-beam intensity may be excessively high. Then the e-beam source can be adjusted to decrease the e-beam intensity.

Figure 6:
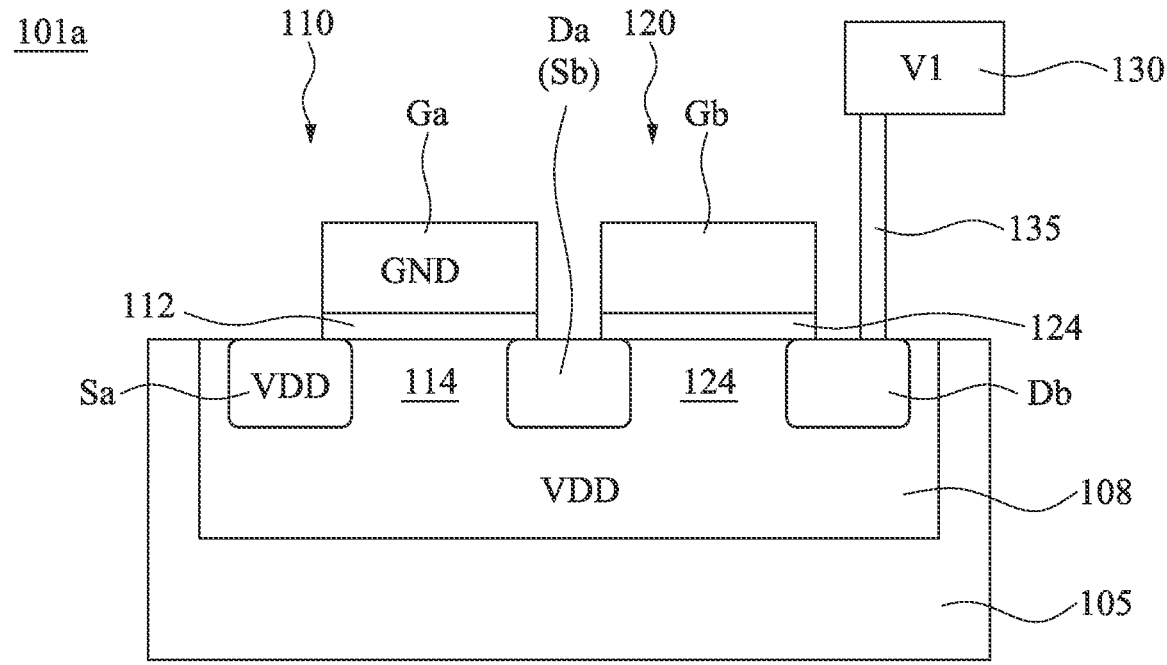
FIG. 6 is a schematic cross-sectional view illustrating an exemplary detector unit at a reading operation according to some embodiments of the present disclosure.

Reading—FIG. 6 is a schematic cross-sectional view illustrating an exemplary detector unit 101a at a reading operation according to some embodiments of the present disclosure. The read cycle is started by pre-charging the bit line BLi with different testing voltages V1, then charging the source Sa of the first transistor 110 and the well region 108 to VDD while the gate Ga of the first transistor 110 is set to be about 0 (ground, (GND)). Therefore, the electrons in the gate Gb of the second transistor 120 are extracted, and the current value of the bit line BLi varies with different bit line voltages. In some embodiments, the testing voltage V1 is in a range of about GND to about VDD.

Figure 7:
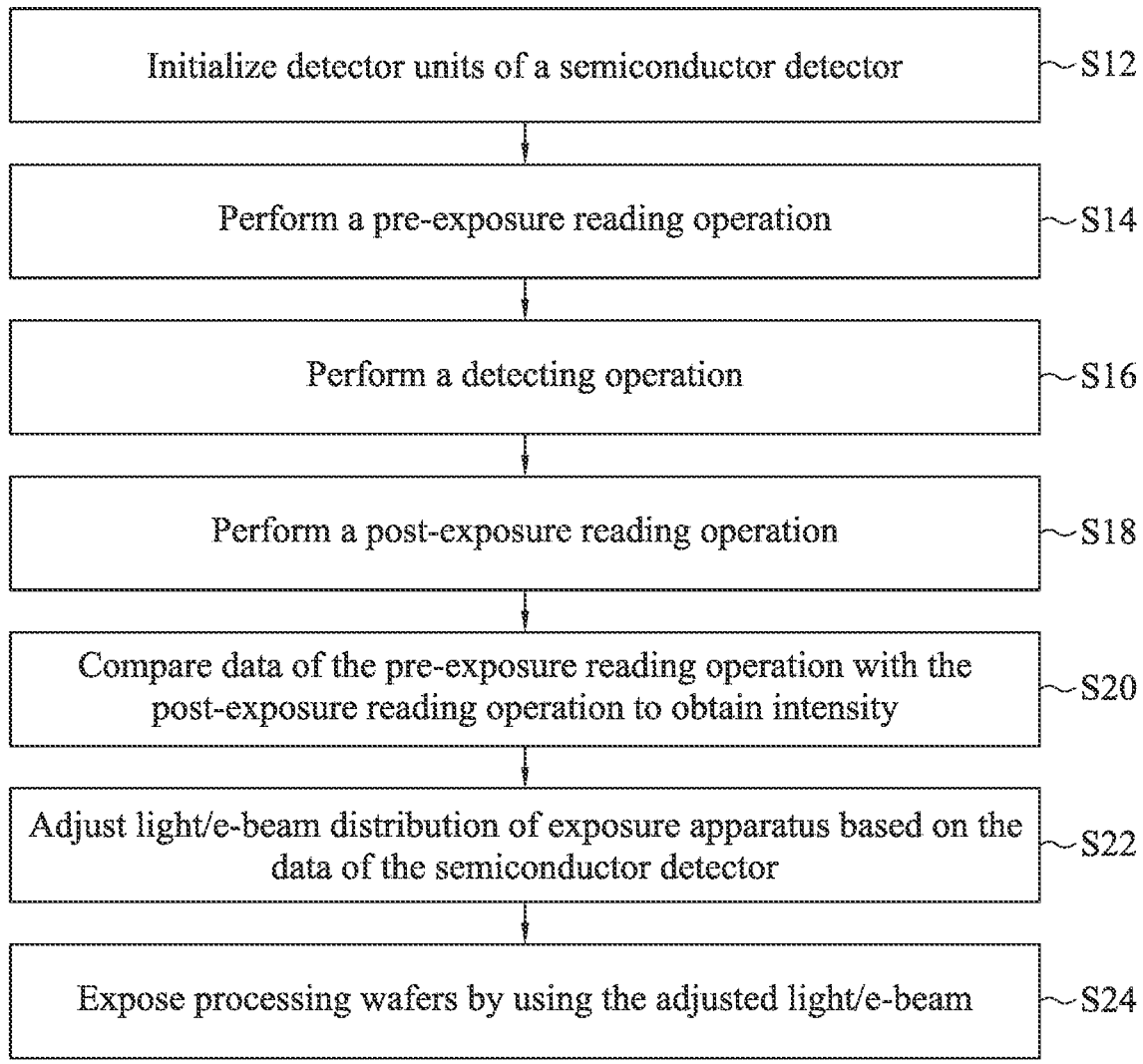
FIG. 7 is a flowchart of a method for detecting light uniformity of EUV/DUV/e-beam according to aspects of the present disclosure in various embodiments.

FIG. 7 is a flowchart of a method M10 for detecting light uniformity of EUV/DUV/e-beam according to aspects of the present disclosure in various embodiments. The method M10 is merely an example and is not intended to limit the present disclosure beyond what is explicitly recited in the claims. Additional operations can be provided before, during, and after the method M10, and some operations described can be replaced, eliminated, or moved around for additional embodiments of the process. For clarity and ease of explanation, some elements of the figures have been simplified.

Various operations of the method M10 are discussed in association with cross-section diagrams FIGS. 4-8B. Throughout the various views and illustrative embodiments, like reference numbers are used to designate like elements. In operation S12 of FIG. 7, the detector units of the semiconductor detector are initialized. For example, each of the gates of the second transistors in each detector units is charged with electrons when the semiconductor detector is used to detect the uniformity of EUV or DUV light. That is, the electrons are injected into the gates of the second transistors. In some embodiments, the electrons in the gates of the second transistors are in saturation states after the initialization process. The initialization of the detector units is described in FIG. 4. On the other hand, each of the gates of the second transistors in each detector units is neutral or substantially neutral when the semiconductor detector is used to detect the uniformity of e-beam. Alternatively, each of the gates of the second transistors in each detector units is initialized to be a non-saturation state when the semiconductor detector is used to detect the uniformity of e-beam.

According to the abovementioned description, in some embodiments, the first and second transistors of the detector units of the semiconductor detector are P-type transistors for sensing EUV/DUV light, such that electrons can be injected into the gate of the second transistor in the initialization state. As such, the electrons in the gate of the second transistor can be removed when the EUV/DUV light illuminated (or projected) thereon according to photoelectric effect. The photoelectric effect may not occur or insufficient if the first and second transistors are N-type transistors for sensing EUV/DUV light.

In operation S14 of FIG. 7, a pre-exposure reading operation is performed. For example, a wafer acceptance test (WAT) is performed on product wafers which are going to carry on exposure processes. The wafer acceptance test includes numerous testing items and is a part of IC fabrication process. The wafer acceptance test is used to determine product quality. During the wafer acceptance test, the semiconductor detector (e.g., the semiconductor detector 100 in FIG. 1) is initialized and then the data of the gate of the second transistor of each of the detector units of the semiconductor detector is read by performing the process described in FIG. 6.

Figure 8A:
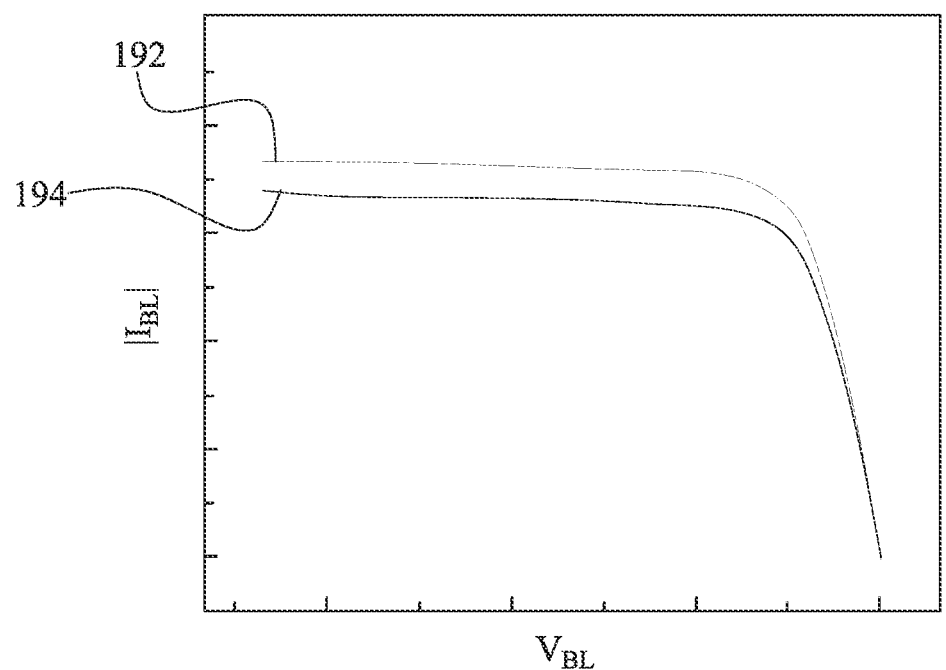
FIG. 8A is a plot of I-V characteristics of a bit line in an exemplary detector unit before and after the detecting operation for EUV/DUV light.

FIG. 8A is a plot of I-V characteristics of a bit line in an exemplary detector unit 101a before and after the detecting operation for EUV/DUV light. Reference is made to FIGS. 6 and 8A. Before the detecting operation, the gate Gb of the second transistor 120 stores electrons, and the line 192 in FIG. 8A shows the I-V curve of the gate Gb before the detecting operation.

Figure 8B:
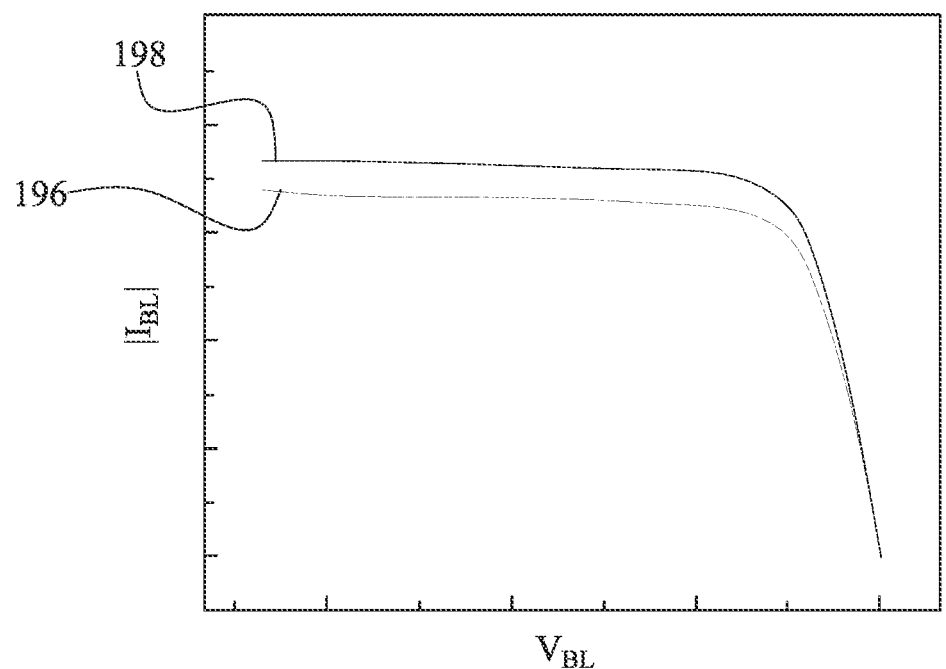
FIG. 8B is a plot of I-V characteristics of a bit line in an exemplary detector unit before and after the detecting operation for e-beam.

FIG. 8B is a plot of I-V characteristics of a bit line in an exemplary detector unit 101a before and after the detecting operation for e-beam. Reference is made to FIGS. 6 and 8B. Before the detecting operation, the gate Gb of the second transistor 110 is neutral or substantially neutral, and the line 196 in FIG. 8B shows the I-V curve of the gate Gb before the detecting operation.

In operation S16 of FIG. 7, a detecting operation is performed to the semiconductor detector. In some embodiments, the semiconductor detector is positioned on a wafer stage of an exposure apparatus (e.g., an EUV exposure apparatus, and DUV exposure apparatus, or an e-beam exposure apparatus). A light source of the exposure apparatus is turned on, and light or e-beam is incident or impinges or illuminates or projects on the semiconductor detector. The gates of the second transistors of the detector units of the semiconductor detector sense the light or e-beam, and amounts of the electrons in the gates are changed. For example, in FIG. 5A, during the detecting operation, the electrons stored in the gate Gb escape due to the exposure of the EUV/DUV light. As such, after the detecting operation, the amount of the electrons in the gate Gb of the second transistor 120 is reduced. Further, in FIG. 5B, during the detecting operation, electrons of the e-beam enter the gate Gb. As such, after the detecting operation, the amount of the electrons in the gate Gb of the second transistor 120 is increased. Since there is no power applied in the detecting operation, the detecting operation of the semiconductor detector is powerless.

In operation S18 of FIG. 7, a post-exposure reading operation is performed. For example, another wafer acceptance test (WAT) is performed on the semiconductor detector. During the wafer acceptance test, the data of the gate of the second transistor of each of the detector units of the semiconductor detector is read again by performing the process described in FIG. 6. In FIG. 8A, the line 194 shows the I-V curve of the gate Gb after the EUV/DUV detecting operation. In FIG. 8B, the line 198 shows the I-V curve of the gate Gb after the e-beam detecting operation.

In operation S20 of FIG. 7, data of the pre-exposure reading operation and the post-exposure reading operation are compared to obtain intensity. Specifically, by comparison the I-V curves of the pre- and post-exposure reading operations, the electron variation of each gate can be determined, and the corresponding spatial light/e-beam intensity can be obtained.

In operation S22 of FIG. 7, the light/e-beam distribution of the exposure apparatus is adjusted based on the data of the semiconductor detector. Specifically, the spatial distribution of the light/e-beam of the semiconductor detector is obtained in the operation S20. If the spatial distribution is not desired (such as non-uniform), parameters of the exposure apparatus are tuned to form a light/e-beam having more uniform spatial distribution. For example, the parameters are EUV/DUV light intensity and e-beam dosage.

In operation S24 of FIG. 7, product wafers are exposed by using the adjusted light/e-beam. For example, the product wafers each include a photoresist, which can be exposed by the adjusted light/e-beam. The photoresist can then be developed and a patterned photoresist is formed. With the embodiments of the method M10, the patterning quality of the photoresists is improved.

Figure 9D:
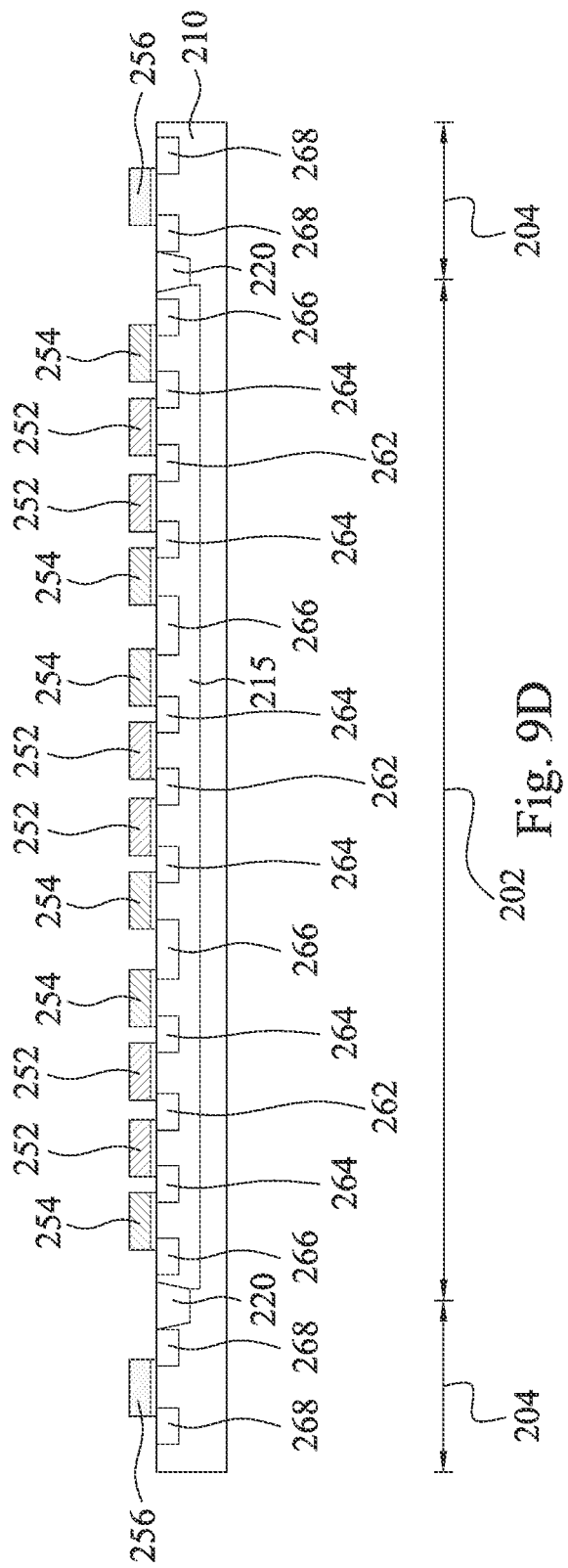

FIGS. 9A-9H illustrate a method for manufacturing a semiconductor structure in different stages in accordance with some embodiments. Reference is made to FIG. 9A. A substrate 210 is provided. The substrate 210 includes at least one sensing region 202 and at least one peripheral region 204. At least one semiconductor detector will be formed on the sensing region 202, and at least one peripheral circuit will be formed on the peripheral region 204. For example, a peripheral circuit connected/coupled to the semiconductor detector for applying powers to the semiconductor detector can be formed on the peripheral region 204. For ease of explanation, it is assumed that in FIGS. 9A-9H, the substrate 210 includes one sensing region 202 and two peripheral regions 204 laterally surrounding the sensing region 202. In some embodiments, the substrate 210 may include silicon (Si). Alternatively, the substrate 210 may include germanium (Ge), silicon germanium (SiGe), gallium arsenide (GaAs) or other appropriate semiconductor materials. In some embodiments, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 210 may include any of a variety of substrate structures and materials.

In various embodiments, the semiconductor substrate 210 may include a buried layer such as an n-type buried layer (NBL), a p-type buried layer (PBL), and/or a buried dielectric layer including a buried oxide (BOX) layer. In some embodiments, the semiconductor substrate 210 includes a p-type silicon substrate (p-substrate). For example, p-type dopants are introduced into the semiconductor substrate 210 to form the p-substrate. To form a semiconductor detector, an n-type buried layer, i.e., n-well (NW), may be implanted deeply under the active region of the semiconductor detector as described below.

Specifically, a well region 215 is formed in the sensing region 202 of the substrate 210. In some embodiments, the well region 215 is formed by ion implantation. In some embodiments, when an N-type well is desired, arsenic or phosphorus ions are implanted to form the well region 215. In some other embodiments, the well region 215 is formed by selective diffusion. The well region 215 functions to electrically isolate the p-substrate.

In some embodiments, isolation structures 220 such as shallow trench isolations (STI) or local oxidation of silicon (LOCOS) (or field oxide, FOX) including isolation features may be formed in the semiconductor substrate 210 to define and electrically isolate various active regions so as to prevent leakage current from flowing between adjacent active regions. For example, the isolation structures 220 may be formed between the sensing region 202 and the peripheral region 204 of the substrate 210. As one example, the formation of the isolation structures 220 may include dry etching a trench in the substrate 210 and filling the trench with insulator materials such as silicon oxide, silicon nitride, or silicon oxynitride. The filled trench may have a multilayer structure such as a thermal oxide liner layer filled with silicon nitride or silicon oxide. In some other embodiments, the isolation structures 220 may be created using a processing sequence such as: growing a pad oxide, forming a low pressure chemical vapor deposition (LPCVD) nitride layer, patterning an opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride.

Reference is made to FIG. 9B. A gate dielectric film 230 and a conductive film 240 are subsequently formed above the substrate 210. The gate dielectric film 230 may include a silicon oxide layer. Alternatively, the gate dielectric film 230 may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. The gate dielectric film 230 may have a multilayer structure such as one layer of silicon oxide and another layer of high k material. The gate dielectric film 230 may be formed using chemical vapor deposition (CVD), physical vapor deposition (PVD), atomic layer deposition (ALD), thermal oxide, other suitable processes, or combinations thereof.

The conductive film 240 may include a doped polycrystalline silicon (or polysilicon). Alternatively, the conductive film 240 may include a metal such as Al, Cu, W, Ti, Ta, TiN, TaN, NiSi, CoSi, other suitable conductive materials, or combinations thereof. The conductive film 240 may be formed by CVD, PVD, plating, and other proper processes. The conductive film 240 may have a multilayer structure and may be formed in a multi-step process using a combination of different processes.

Reference is made to FIG. 9C. The conductive film 240 in FIG. 9B are patterned to form a plurality of first gate electrodes 252, second gate electrodes 254, and third gate electrodes 256 on the substrate 210. Specifically, the first gate electrodes 252 and the second gate electrodes 254 are formed above the sensing region 202 of the substrate 210, and the third gate electrodes 256 are formed above the peripheral region 204 of the substrate 210. The gate dielectric film 230 of FIG. 9B is then patterned to be gate dielectric layers 235 between the first gate electrodes 252 (second gate electrodes 254, third gate electrodes 256) and the substrate 210. The first gate electrodes 252 and the third gate electrodes 256 may be configured to be coupled to metal interconnects. The conductive film 240 formed on the substrate 210 is patterned to form the first gate electrodes 252, the second gate electrodes 254, and the third gate electrodes 256 using a process including photolithography patterning and etching.

Reference is made to FIG. 9D. Source/drain regions 262, 264, 266, and 268 are formed in the well regions 215. The source/drain regions 262, 264, 266, and 268 are heavily doped regions. In some embodiments, the source/drain regions 262, 264, 266, and 268 include p-type dopants such as boron, boron difluoride, combinations thereof, or the like. The source/drain regions 262, 264, 266, and 268 may be formed by a method such as ion implantation or diffusion. A rapid thermal annealing (RTA) process may be used to activate the implanted dopant. In various embodiments, the source/drain regions 262, 264, 266, and 268 may have different doping profiles formed by multi-process implantation.

In FIG. 9D, the source/drain regions 262 and 264 are formed on opposite sides of the first gate electrode 252, the source/drain regions 264 and 266 are formed on opposite sides of the second gate electrode 254, and the source/drain regions 268 are formed on opposite sides of the third gate electrode 256.

In some embodiments, prior to forming the source/drain regions 262, 264, 266, and 268, gate spacers can be formed on sidewalls of the first gate electrodes 252, second gate electrodes 254, and third gate electrodes 256. The gate spacers may be dielectric materials, such as silicon nitride, silicon oxide, or combinations thereof.

Figure 9E:
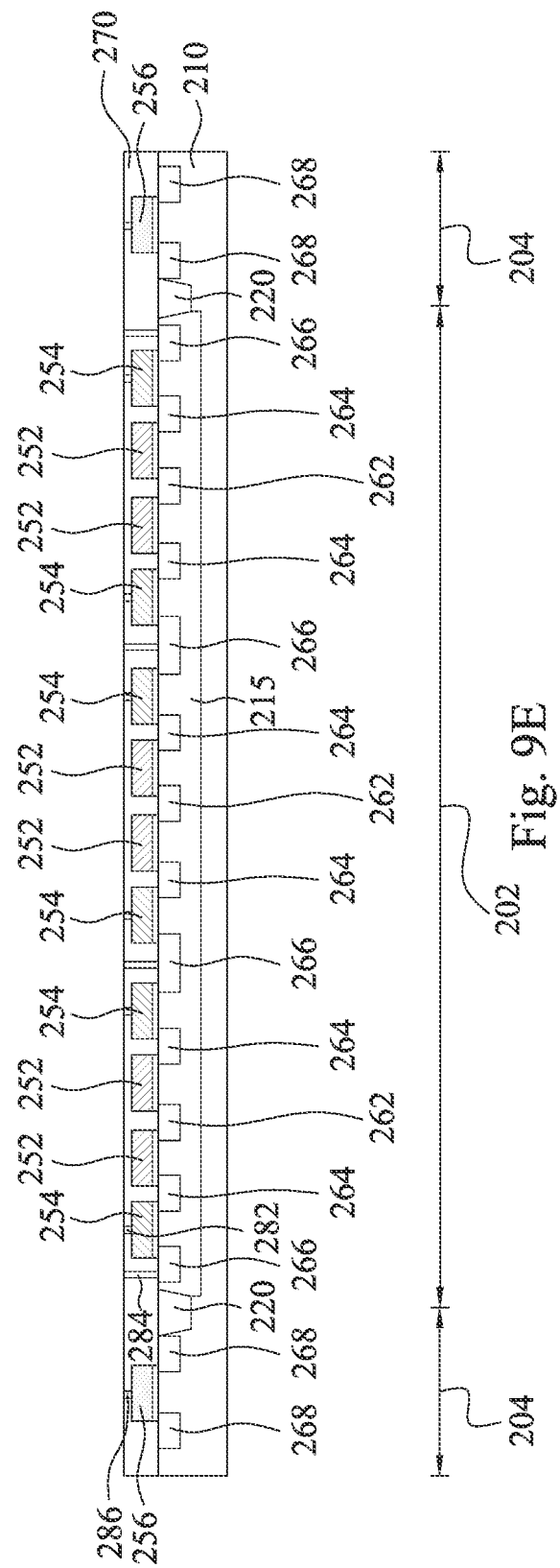

Reference is made to FIG. 9E. A first interlayer dielectric (ILD) 270 is formed above the structure in FIG. 9D. The first ILD 270 may include silicon oxide. Alternatively or additionally, the first ILD 270 includes a material having a low dielectric constant such as a dielectric constant less than about 3.5. In some embodiments, the first ILD 270 includes silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (his-benzocyclobutenes), SiLK (Dow Chemical, Midland, Mich.), and/or other suitable materials. The first ILD 270 may be formed by a technique including spin-on coating, CVD, or other suitable processes. In some embodiments, a contact etch stop layer (CESL) is formed above the structure in FIG. 9D prior to forming the first ILD 270. The CESL may be a dielectric layer such as a nitride layer (e.g., $SiN_x$) or other suitable materials.

In some embodiments, a replacement gate (RPG) process scheme is employed. In the RPG process scheme, a dummy polysilicon gate (the first gate electrodes 252, the second gate electrodes 254, and/or the third gate electrodes 256 in this case) is formed in advance and is replaced later by a metal gate structure. The metal gate structure may include a gate dielectric layer and a metal gate electrode over the gate dielectric layer.

Subsequently, a plurality of contacts 282, 284 and 286 are formed in the first ILD 270. For example, a plurality of the openings are formed in the first ILD 270, and conductive materials are filled in the openings. The excess portions of the conductive materials are removed to form the contacts 282, 284 and 286. The contacts 282, 284 and 286 may be made of tungsten, aluminum, copper, or other suitable materials. In some embodiments, the contacts 282 are respectively connected to the second gate electrodes 254, the contacts 284 are respectively connected to the source/drain regions 266, and the contacts 286 are respectively connected to the third gate electrodes 256. In some other embodiments, additional contacts are formed in the first ILD 270 to be connected to other elements (e.g., the source/drain regions 268, the first gate electrodes 252, and/or the source/drain regions 262).

Figure 9F:
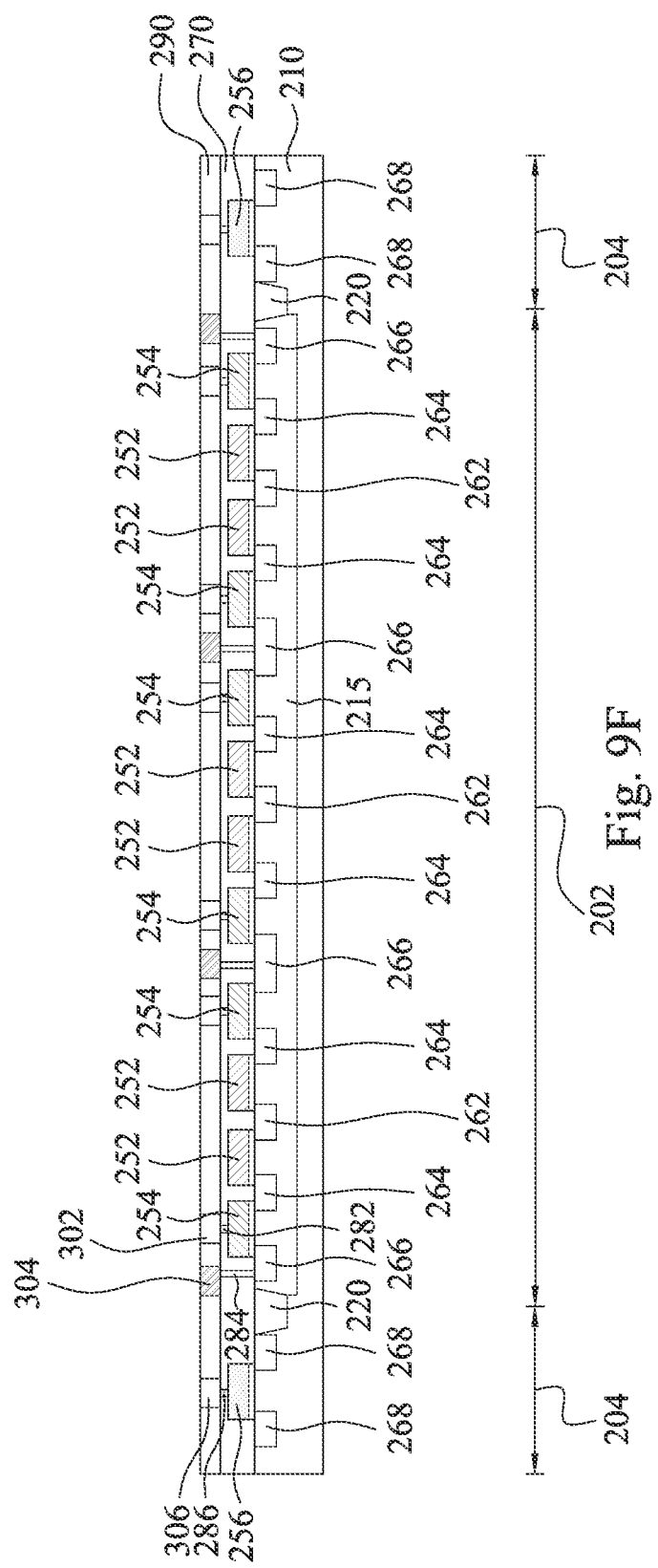

Reference is made to FIG. 9F. A plurality of conductive features 302, 304, and 306 are formed above the first ILD 270. For example, a second ILD 290 is formed above the first ILD 270 in advance. A plurality of the openings are formed in the second ILD 290 to respectively expose the contacts 282, 284 and 286. Conductive materials are filled in the openings, and the excess portions of the conductive materials are removed to form the conductive features 302, 304, and 306. The conductive features 302, 304, and 306 may be made of tungsten, aluminum, copper, or other suitable materials. The conductive features 302 are respectively formed above the second gate electrodes 254 and the contacts 282, such that the conductive features 302 are electrically connected to the second gate electrodes 254, respectively. The conductive features 304 are respectively formed above the source/drain regions 266 and the contacts 284, such that the conductive features 304 are electrically connected to the source/drain regions 266, respectively. The conductive features 304 may be referred to as bit lines of the resulting semiconductor detector. The conductive features 306 are respectively formed above the third gate electrodes 256 and the contacts 286, such that the conductive features 306 are electrically connected to the third gate electrodes 256, respectively. In some other embodiments, additional conductive features are formed in the second ILD 290 to be connected to other elements (e.g., the source/drain regions 268, the first gate electrodes 252, and/or the source/drain regions 262).

Figure 9G:
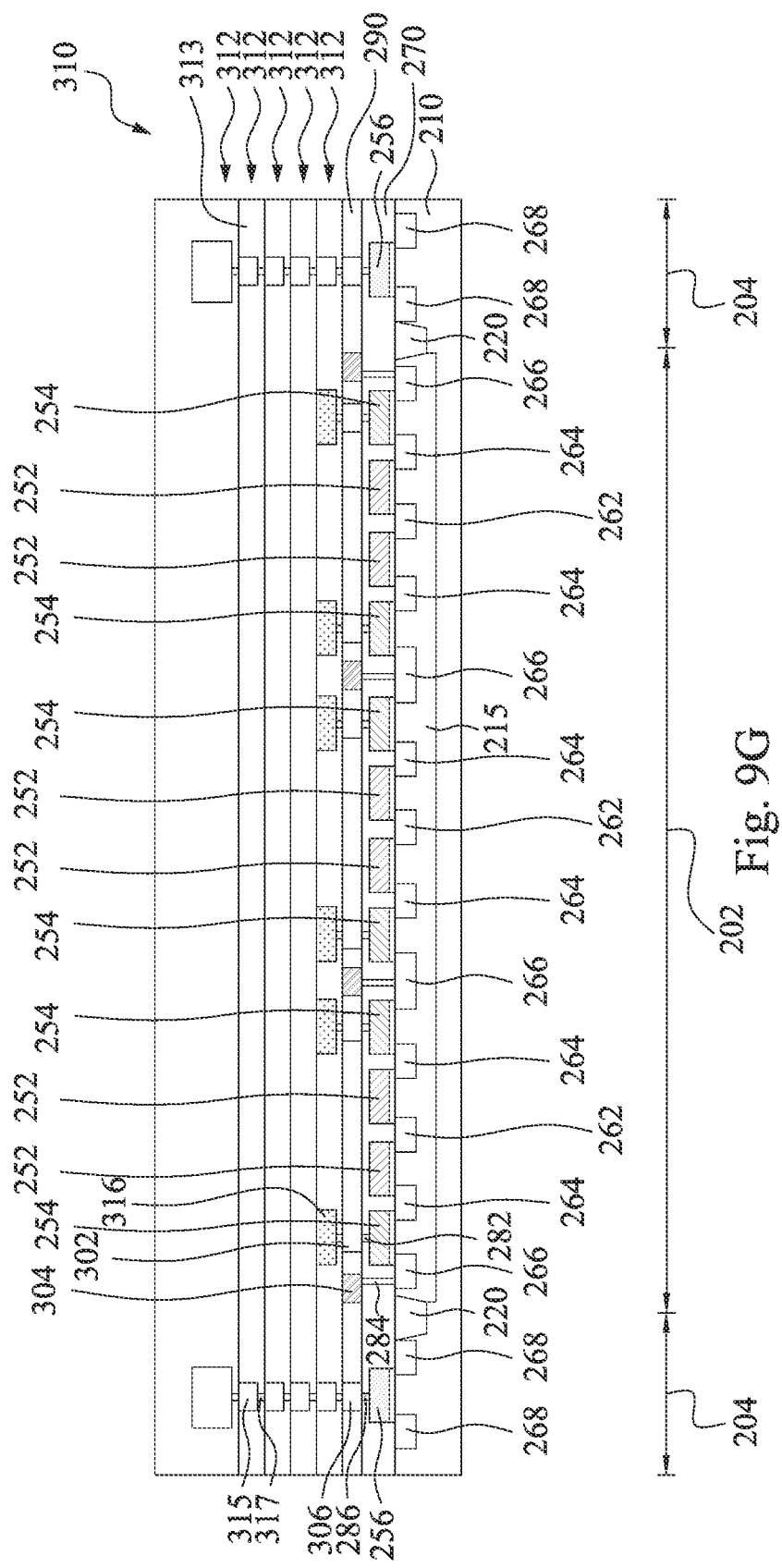

Reference is made to FIG. 9G. A multilayer interconnection (MLI) structure 310 is formed over the substrate 210. The MLI structure 310 may include a plurality of metallization layers 312. The number of metallization layers 312 may vary according to design specifications of the semiconductor structure. Only five metallization layers 312 are illustrated in FIG. 9G for the sake of simplicity. The metallization layers 312 include one or more horizontal interconnects, such as metal lines 315, metal pads 316, respectively extending horizontally or laterally in the metallization layers 312 and vertical interconnects, such as conductive vias 317, respectively extending vertically in the metallization layers 312. In some embodiments, the metal pads 316 are made of conductive materials, such as semiconductor materials, metals, or the like.

In some embodiments, metal pads 316 in a bottommost metallization layer 312 are coupled to the conductive features 302 to make electrical connection to the second gate electrodes 254, and some metal lines 315a in the bottommost metallization layer 312 are in contact with the conductive features 306 to make electrical connection to the third gate electrodes 256. In some embodiments, some metal lines 315b in a topmost metallization layer 312 are thicker and/or larger than the metal lines 315 below the topmost metallization layer 312. In some embodiments, the metal lines 315b are above the peripheral region 204 of the substrate 210 and are not directly above the sensing region 202 of the substrate 210.

The metal lines 315, the metal pads 316 and the conductive vias 317 can be formed using, for example, a single damascene process, a dual damascene process, the like, or combinations thereof. In some embodiments, inter-metal dielectric (IMD) layers 313 in the metallization layers 312 may include low-k dielectric materials having k values, for example, lower than about 4.0 or even 2.0 disposed between such conductive features. In some embodiments, the IMD layers 313 may be made of, for example, phosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The metal lines 315, the pads 316 and the conductive vias 317 may include metal materials such as copper, aluminum, tungsten, combinations thereof, or the like. In some embodiments, the metal lines 315, the metal pads 316 and the conductive vias 317 may further include one or more barrier/adhesion layers (not shown) to protect the respective IMD layers 313 from metal diffusion (e.g., copper diffusion) and metallic poisoning. The one or more barrier/adhesion layers may include titanium, titanium nitride, tantalum, tantalum nitride, or the like, and may be formed using physical vapor deposition (PVD), CVD, ALD, or the like.

Figure 9H:
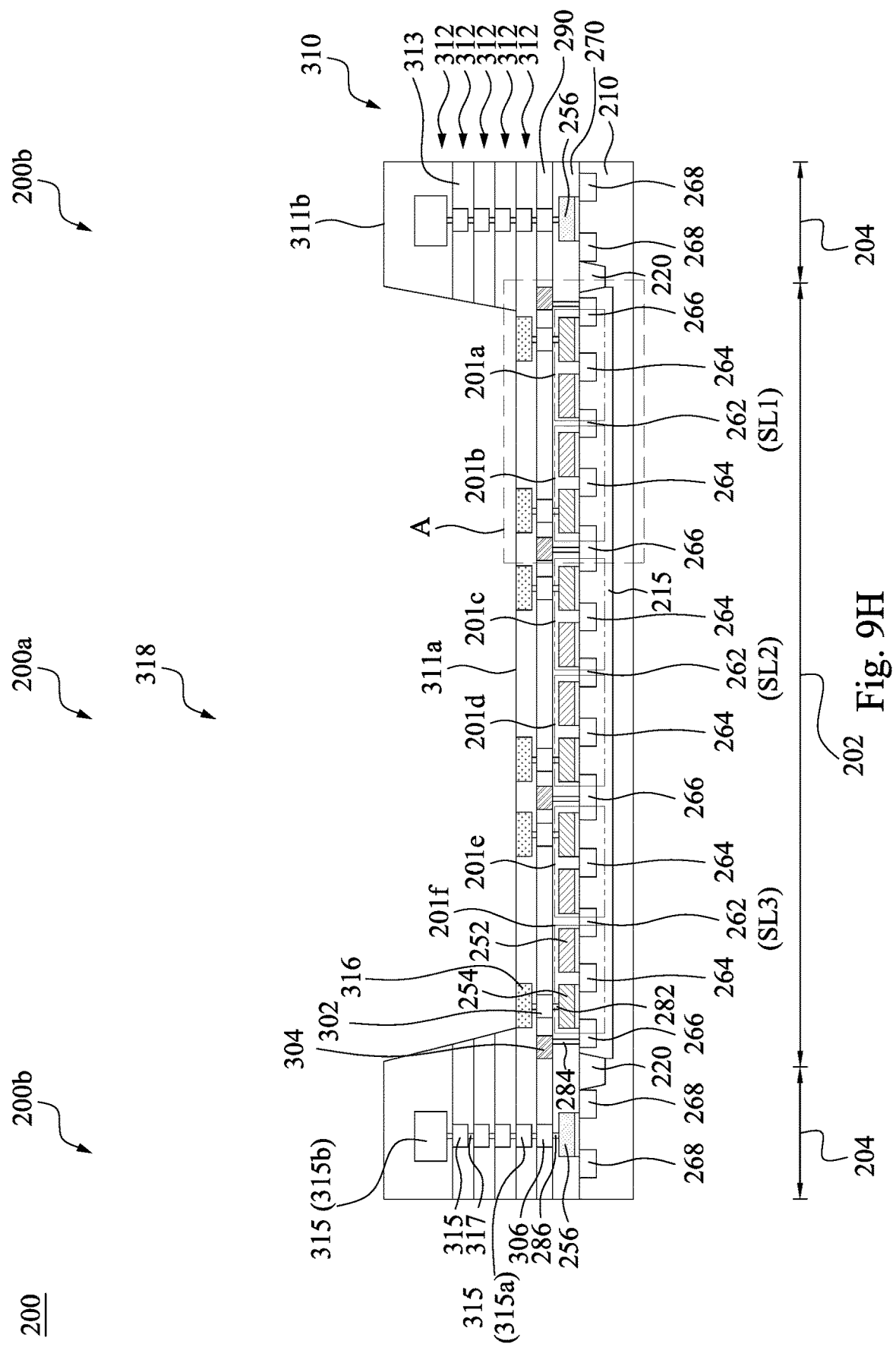

Reference is made to FIG. 9H. Optionally, a portion of the MLI structure 310 directly above the sensing region 202 of the substrate 210 is removed to form a recess 318 therein, such that the metal pads 316 are exposed by the recess 318. As such, a topmost surface 311a of the multilayer interconnection structure 310 directly above the sensing region 202 of the substrate 210 is lower than a topmost surface 311b of the multilayer interconnection structure 310 directly above the peripheral region 204 of the substrate 210. With such configuration, EUV/DUV/e-beam can directly impinge on the metal pads 316 to increase the sensing ability of the second gate electrodes 254. In some embodiments, the operation in FIG. 9H can be omitted if the IMD layers 313 of the MLI structure 310 barely absorb EUV/DUV/e-beam light.

Figure 10A:
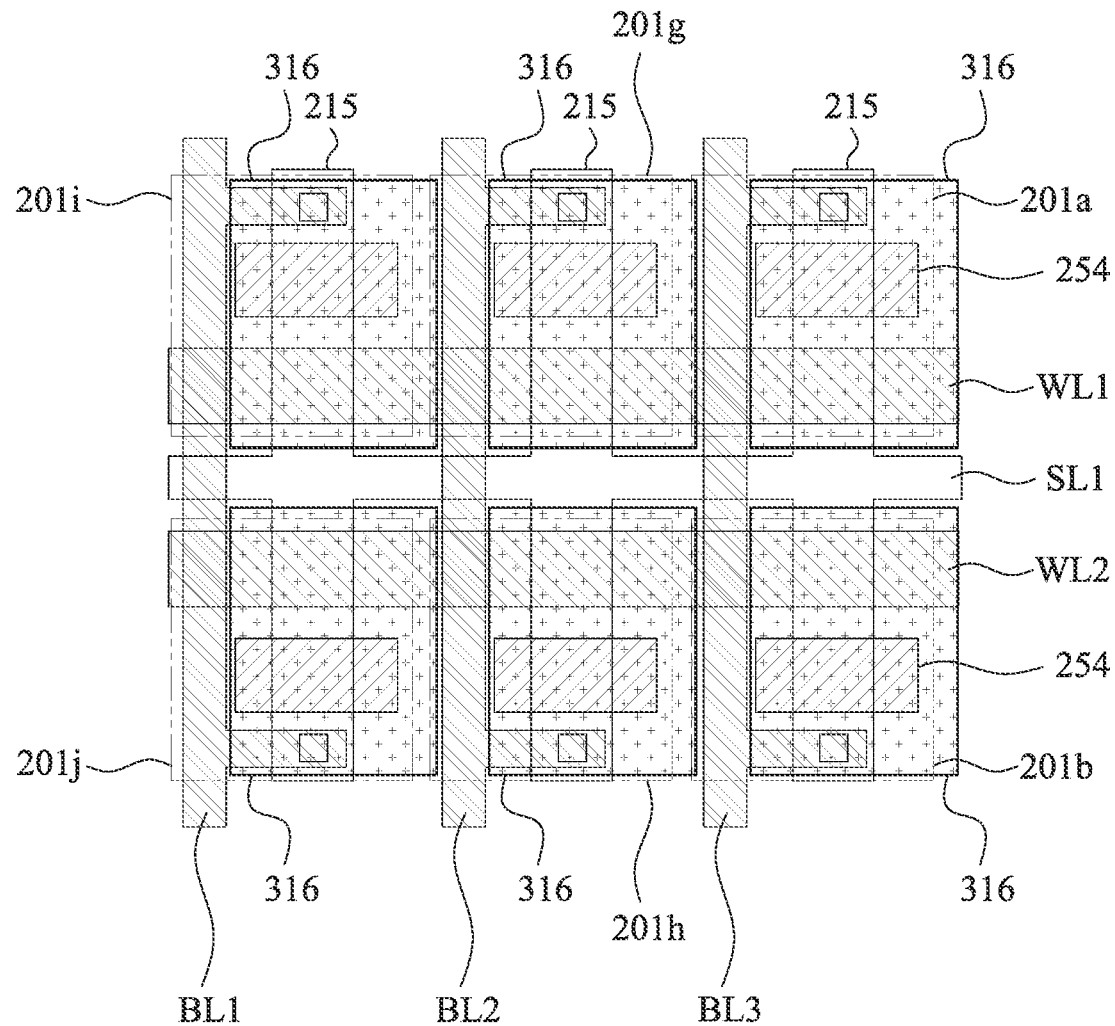
FIG. 10A is a top view of an area A in FIG. 9H.
Figure 10B:
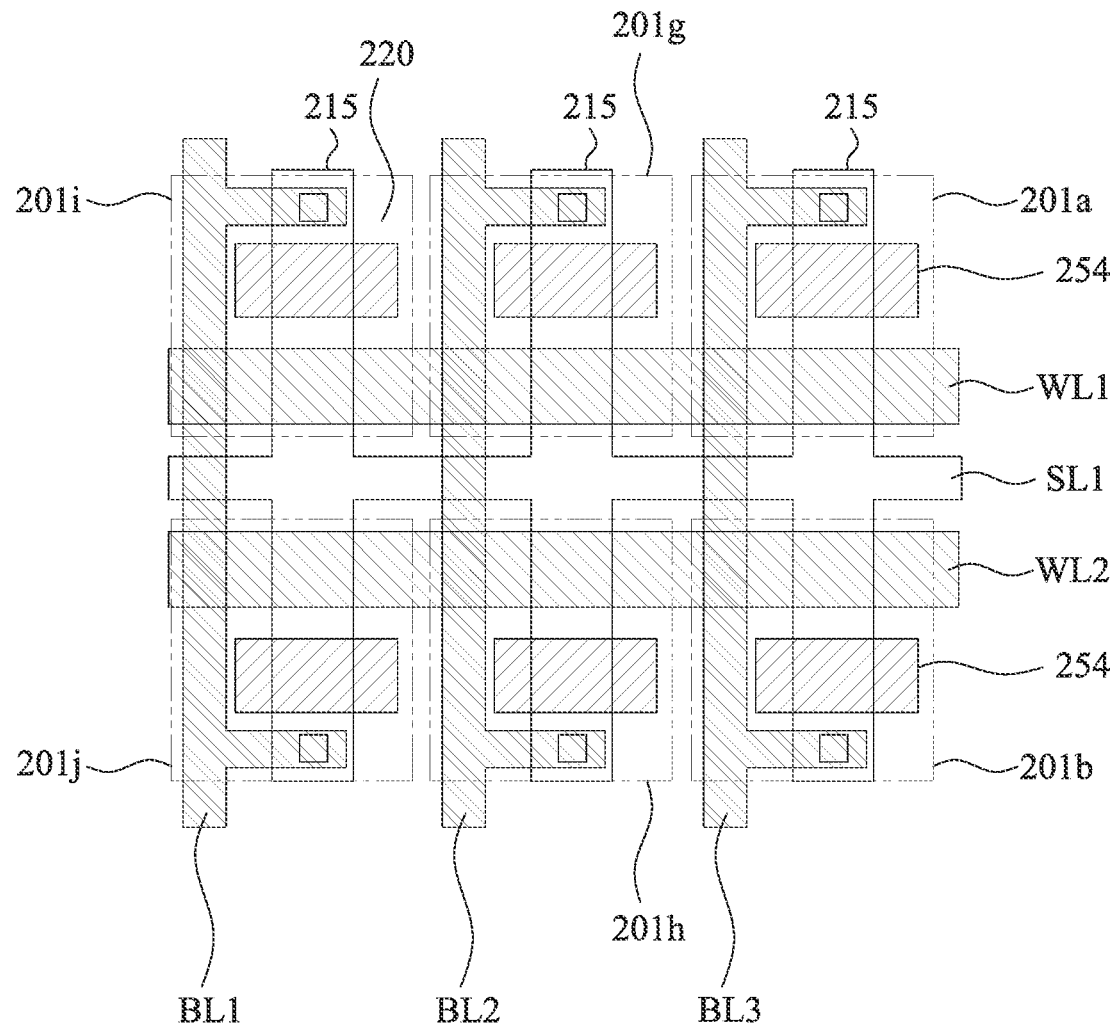
FIG. 10B is a top view of the semiconductor detector without the metal pads in FIG. 10A.

FIG. 10A is a top view of an area A in FIG. 9H, and FIG. 10B is a top view of the semiconductor detector without the metal pads 316 in FIG. 10A. Reference is made to FIGS. 9H, 10A, and 10B. The semiconductor structure includes a semiconductor detector 200a and at least one peripheral circuit(s) 200b. The semiconductor detector 200a is above the sensing region 202 of the substrate 210, and the peripheral circuit(s) 200b is above the peripheral region 204 of the substrate 210. In some embodiments, the peripheral circuit 200b is electrically connected to the semiconductor detector 200a to apply powers to the semiconductor detector 200a during the initializing/reading operations of the semiconductor detector 200a. For example, the peripheral circuit 200b is connected to the word lines (i.e., the first gate electrodes 252), the bit lines (i.e., the source/drain regions 266), and the source lines (i.e., the source/drain regions 262) of the semiconductor detector 200a.

The semiconductor detector 200a includes a plurality of detector units 201a, 201b, 201c, 201d, 201e, 201f, 201g, 201h, 201i, and 201j. In some embodiments, all of the detector units 201a-201h have an identical structure but different orientations. In greater detail, the detector units 201a, 201g, and 201i and the detector units 201b, 201h, and 201j are symmetric with relative to the source line SL1 (see FIG. 10A), the detector unit 201c and the detector unit 201d are symmetric with relative to the source line SL2 (see FIG. 9H), and the detector unit 201e and the detector unit 201f are symmetric with relative to the source line SL3 (see FIG. 9H).

The source lines SL1, SL2, and SL3 may be implantation regions within the substrate 210. For example, the source line SL1 is connected to the source/drain regions 262 of adjacent detector units (e.g., the detector units 201a, 201b, and 201g-201j in FIGS. 10A and 10B). The detector units 201a-201f may share the same bit line (i.e., the bit line BL3 in FIG. 10A), the detector units 201g and 201h may share the same bit line (i.e., the bit line BL2 in FIG. 10A), and the detector units 201i and 201j may share the same bit line (i.e., the bit line BL1 in FIG. 10A). The first gate electrodes 252 of the detector units 201a, 201g, and 201i may share the same word line (i.e., the word line WL1 in FIG. 10A), and the first gate electrodes 252 of the detector units 201b, 201h, and 201j may share the same word line (i.e., the word line WL2 in FIG. 10A). With such configuration, the array density of the semiconductor detector 200a is improved/increased. In some embodiments, the metal pads 316 may be omitted as shown in FIG. 10B. That is, light (EUV/DUV/e-beam) directly impinges on the second gate electrodes 254.

Figure 11:
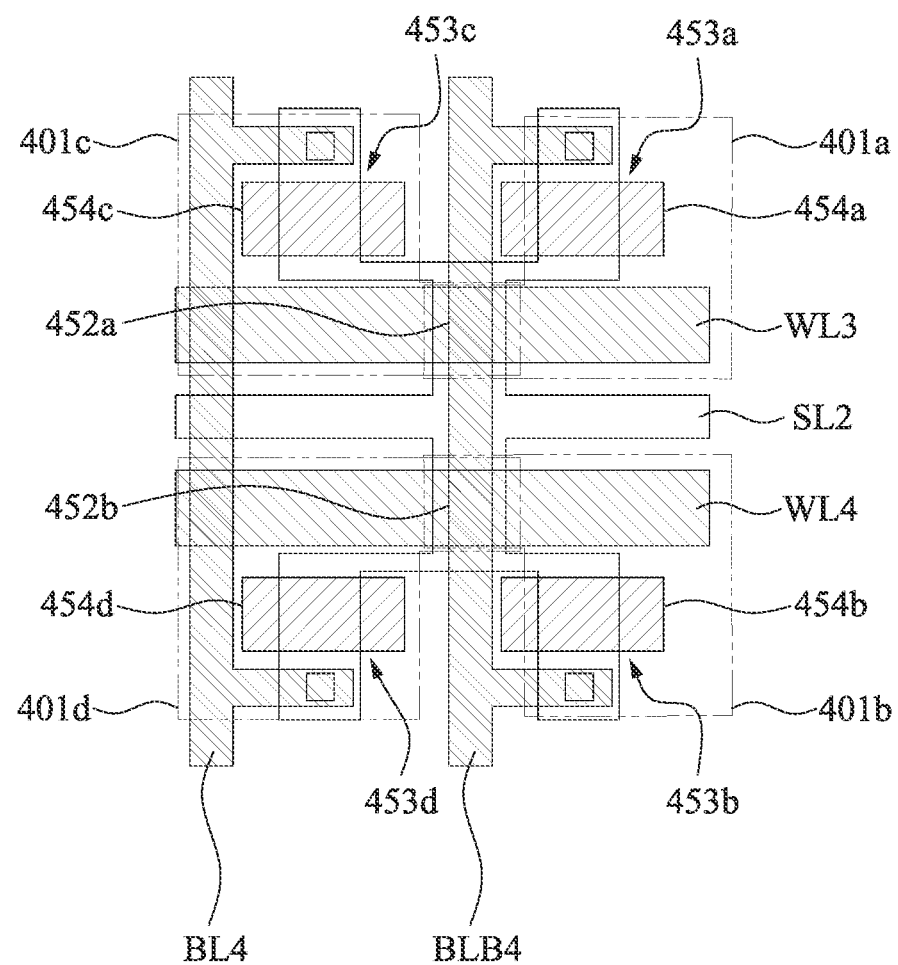
FIG. 11 is a top view of the semiconductor detector in accordance with some embodiments.

The layout design of the semiconductor detector is not limited to FIGS. 10A and 10B. FIG. 11 is a top view of the semiconductor detector 400 in accordance with some embodiments. The difference between the semiconductor detectors in FIGS. 11 and 10B pertains to the configurations of the detector units. In FIG. 11, the semiconductor detector 400 includes exemplary detector units 401a, 401b, 401c, and 401d. The detector units 401a-401b and the detector units 401c-401d are symmetric with relative to one of the bit lines (i.e., bit line BLB4), and the detector units 401a, 401c and the detector units 401b, 401d are symmetric with relative to the source line SL2. The detector units 401a and 401c share the same first transistor 452a, and the detector units 401b and 401d share the same first transistor 452b. The word line WL3 is connected to the first transistor 452a, and the word line WL4 is connected to the first transistor 452b. The second gate electrodes 454a, 454b, 454c, and 454d of the detector units 401a-401d are separated from each other. The detector units 401a and 401b are further connected to the bit line BLB4, and the detector units 401c and 401d are further connected to the bit line BL4. In some embodiments, the bit line BLB4 and the bit line BL4 carry complementary bit-line signals. With such configuration, the second transistors 453a and 453c form a differential scheme, and the second transistors 453b and 453d form another differential scheme, systematic offset of the reading data can be canceled. Other relevant structural details of the semiconductor detector 400 are substantially the same as or similar to that of the semiconductor detector 200a of FIGS. 9H-10B, and, therefore, a description in this regard will not be repeated hereinafter.

Figure 12:
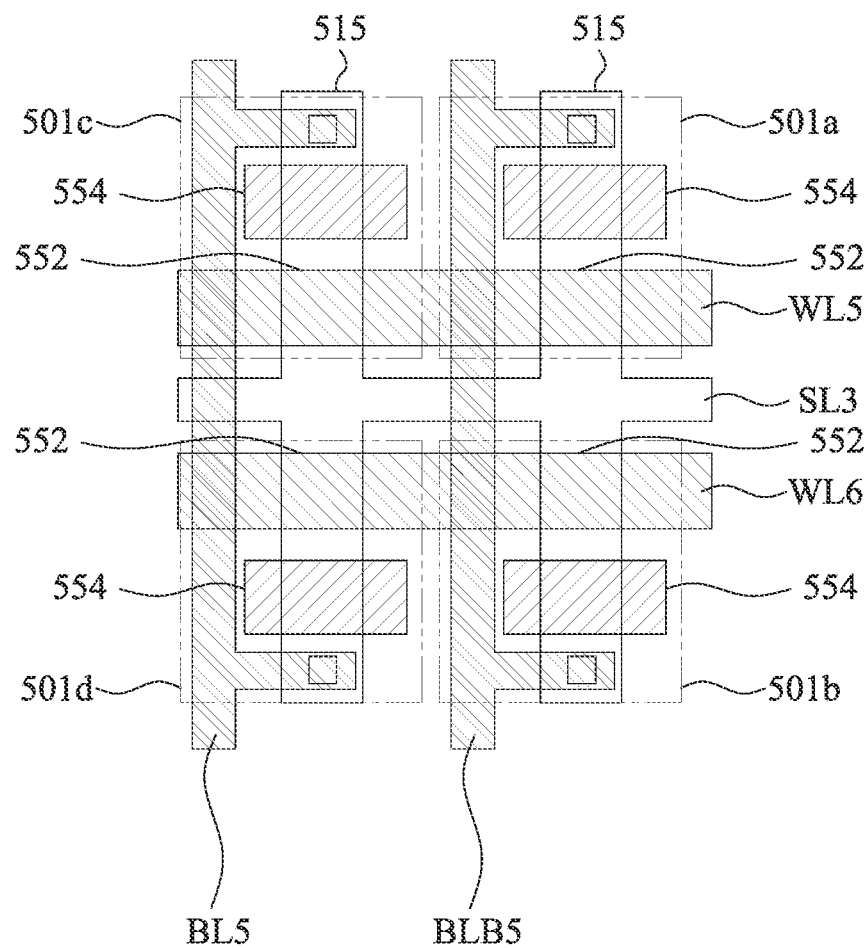
FIG. 12 is a top view of the semiconductor detector in accordance with some embodiments.

FIG. 12 is a top view of the semiconductor detector 500 in accordance with some embodiments. The difference between the semiconductor detectors in FIGS. 12 and 10B pertains to the configurations of the detector units. In FIG. 12, the semiconductor detector 500 includes exemplary detector units 501a, 501b, 501c, and 501d. The detector units 501a, 501c and the detector units 501b, 501d are symmetric with relative to the source line SL3. The word line WL5 is connected to the first gate electrodes 552 of the detector units 501a and 501c, and the word line WL6 is connected to the first gate electrodes 552 of the detector units 501b and 501d. The second gate electrodes 554 of the detector units 501a-501d are separated from each other. The detector units 501a and 501b are further connected to the bit line BLB5, and the detector units 501c and 501d are further connected to the bit line BL5. In some embodiments, the bit line BLB5 and the bit line BL5 carry complementary bit-line signals. With such configuration, after subtracting the read current from two second gate electrodes 554 of the detector units 501a and 501c (or the two second gate electrodes 554 of the detector units 501b and 501d), tiny sensing area difference is obtained, resulting in high spatial resolution. Other relevant structural details of the semiconductor detector 500 are substantially the same as or similar to that of the semiconductor detector 200a of FIGS. 9H-10B, and, therefore, a description in this regard will not be repeated hereinafter.

Figure 13:
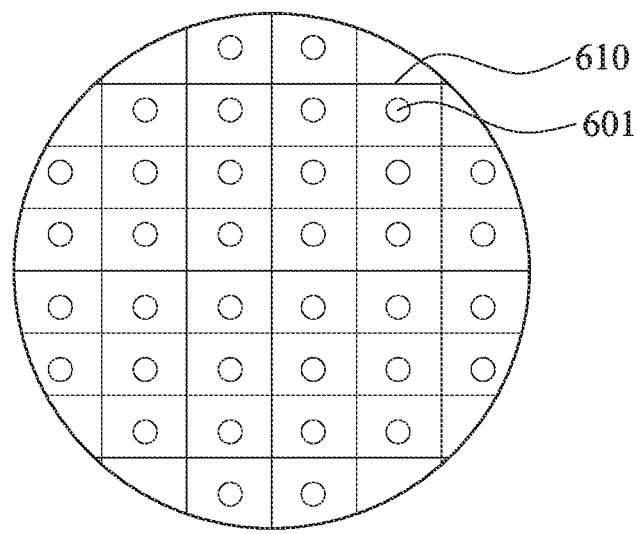
FIG. 13 is a top view of a semiconductor structure, in accordance with some embodiments.

FIG. 13 is a top view of a semiconductor structure 600, in accordance with some embodiments. In some embodiments, the semiconductor structure 600 in FIG. 13 is a semiconductor wafer (can be referred to as a test wafer), and a plurality of semiconductor detectors 601, each of which may have a configuration similar to, for example, the semiconductor detector 100 in FIG. 1, are formed thereon. Specifically, there are a plurality of exposure fields 610 (e.g., rectangular or square regions from top view) on the semiconductor structure 600. Each of the exposure fields 610 is an area exposed by the same photomask using an exposure apparatus. For example, the photomask may be utilized in an exposure process to transfer a design layout of a mask to each of the exposure fields 610. That is, each of the exposure fields 610 will include the same pattern of integrated circuits dies after the exposure process. In alternative embodiments, in which relatively large integrated circuits are fabricated, an exposure field may only include a single integrated circuit die.

As shown in FIG. 13, the semiconductor detectors 601 are located in the exposure fields 610, respectively. The positions of the semiconductor detectors 601 in the corresponding exposure fields 610 are not limited to the positions shown in FIG. 13. In some other embodiments, semiconductor detectors 601 may be located near an edge of the exposure fields 610. The semiconductor structure 600 including the semiconductor detectors 601 thereon can be sent to the exposure apparatus to detect the light/e-beam intensity before the exposure process performed on product wafers.

Figure 14:
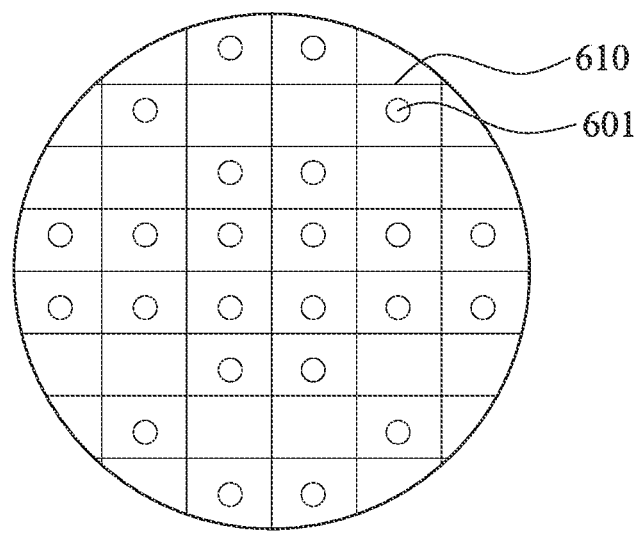
FIG. 14 is a top view of a semiconductor structure, in accordance with some embodiments.

In some other embodiments, as shown in FIG. 14, the semiconductor detectors 601 are located in some of the exposure fields 610. That is, some of the exposure fields 610 are lack of the semiconductor detectors 601. In some embodiments, the semiconductor detectors 601 can be arranged to be symmetric to a center line of the semiconductor wafer, as shown in FIG. 14. In some other embodiments, the semiconductor detectors 601 can be arranged randomly, i.e., non-symmetric to the center of the semiconductor wafer. With the configurations in FIGS. 13 and/or 14, the semiconductor detectors 601 not only can detect the spatial distribution of light/e-beam intensity in a single exposure field 610, but also can detect the spatial distribution of light/e-beam intensity in different exposure fields 610.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the semiconductor detector is powerless during the detecting mode. Another advantage is that the detection and recording of the light/e-beam intensity are in the same element (i.e., the floating gates), and an additional recorder can be omitted to save the layout area. In addition, there are only two transistors in a detector unit to achieve high density and high spatial resolution. Further, the manufacturing of the semiconductor detector is compatibility to semiconductor device (e.g., CMOS) process. For example, the semiconductor detector can be formed on a semiconductor wafer, such that the semiconductor detector can reflect the intensity distribution of the light/e-beam on a product wafer. Also, the data in the floating gate can be readout with (in-line) wafer acceptance tests, and the data can be timely feedback to adjust the light/e-beam intensity.

According to some embodiments, a method includes applying a first voltage to a source of a first transistor of a detector unit of a semiconductor detector in a test wafer and applying a second voltage to a gate of the first transistor and a drain of a second transistor of the detector unit. The first transistor is coupled to the second transistor in series, and the first voltage is higher than the second voltage. A pre-exposure reading operation is performed on the detector unit of the semiconductor detector. Light of an exposure apparatus is projected to a gate of the second transistor of the detector unit after applying the first and second voltages. A post-exposure reading operation is performed on the detector unit of the semiconductor detector. Data of the pre-exposure reading operation is compared with the post-exposure reading operation. An intensity of the light is adjusted based on the compared data of the pre-exposure reading operation and the post-exposure reading operation.

According to some embodiments, a method includes providing a test wafer including a semiconductor detector. The semiconductor detector includes a first transistor and a second transistor coupled in series, and a gate of the second transistor is a floating gate. A pre-exposure reading operation is performed on the semiconductor detector. E-beam is impinged on the gate of the second transistor of the semiconductor detector. A post-exposure reading operation is performed on the semiconductor detector. A beam distribution of the e-beam is adjusted according to data of the pre-exposure reading operation and data of the post-exposure reading operation.

According to some embodiments, a semiconductor structure includes a substrate, a semiconductor detector, a peripheral circuit, and a multilayer interconnection structure. The substrate has a sensing region and a peripheral region. The semiconductor detector is on the sensing region of the substrate. The semiconductor detector includes a first detector unit, a second detector unit, and a third detector unit. Each of the first, second, third detector units includes a first transistor and a second transistor connected in series. A gate of the second transistor is a floating gate. The peripheral circuit is on the peripheral region of the substrate and is coupled to the semiconductor detector. The multilayer interconnection structure is over the substrate. A first number of metallization layers of the multilayer interconnection structure directly above the peripheral circuit is greater than a second number of metallization layers of the multilayer interconnection structure directly above the semiconductor detector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
applying a first voltage to a source of a first transistor of a detector unit of a semiconductor detector in a test wafer and applying a second voltage to a gate of the first transistor and a drain of a second transistor of the detector unit, wherein the first transistor is coupled to the second transistor in series, and the first voltage is higher than the second voltage;
performing a pre-exposure reading operation on the detector unit of the semiconductor detector;
projecting light of an exposure apparatus to a gate of the second transistor of the detector unit after applying the first and second voltages;
performing a post-exposure reading operation on the detector unit of the semiconductor detector;
comparing data of the pre-exposure reading operation with the post-exposure reading operation; and adjusting an intensity of the light based on the compared data of the pre-exposure reading operation and the post-exposure reading operation.

2. The method of claim 1, wherein no power is applied to the first and second transistors during projecting the light of the exposure apparatus to the gate of the second transistor of the detector unit.

3. The method of claim 1, further comprising applying the first voltage to channels of the first and second transistors during applying the first voltage to the source of the first transistor.

4. The method of claim 1, wherein the second voltage is a ground voltage.

5. The method of claim 1, wherein applying the first and second voltages is such that electrons of the gate of the second transistor are in a saturation state.

6. The method of claim 1, wherein performing the pre-exposure reading operation comprises:
charging the gate of the first transistor to the second voltage; and
charging the source of the first transistor to a third voltage higher than the second voltage.

7. The method of claim 6, wherein performing the pre-exposure reading operation further comprises:
charging the drain of the second transistor to a varied testing voltage higher than the second voltage and lower than the third voltage; and
reading a current from the drain of the second transistor under the varied testing voltage.

8. The method of claim 1, further comprising exposing a product wafer by using the light after adjusting the intensity of the light.

9. The method of claim 1, wherein a channel of the second transistor is P-type.

10. A method, comprising:
providing a test wafer comprising a semiconductor detector, wherein the semiconductor detector comprises a first transistor and a second transistor coupled in series, and a gate of the second transistor is a floating gate;
performing a pre-exposure reading operation on the semiconductor detector;
impinging electron-beam (e-beam) on the gate of the second transistor of the semiconductor detector;
performing a post-exposure reading operation on the semiconductor detector; and
adjusting a beam distribution of the e-beam according to data of the pre-exposure reading operation and data of the post-exposure reading operation.

11. The method of claim 10, wherein providing the test wafer comprising the semiconductor detector is such that the gate of the second transistor is substantially free from electrons.

12. The method of claim 10, wherein performing the pre-exposure reading operation comprises applying a varied voltage to a drain of the second transistor of the semiconductor detector to obtain a current value of the drain of the second transistor.

13. The method of claim 10, wherein performing the post-exposure reading operation comprises applying a varied voltage to a drain of the second transistor of the semiconductor detector to obtain a current value of the drain of the second transistor.

14. The method of claim 10, further comprising exposing a product wafer by using the e-beam after adjusting the beam distribution of the e-beam.

15. A method, comprising:
applying a first voltage to a source of a first transistor of a detector unit of a semiconductor detector in a test wafer and applying a second voltage to a gate of the first transistor and a drain of a second transistor of the detector unit, wherein the first transistor is coupled to the second transistor in series, and the first voltage is higher than the second voltage;
performing a pre-exposure reading operation on the detector unit of the semiconductor detector;
projecting light of an exposure apparatus to a gate of the second transistor of the detector unit after applying the first and second voltages;
performing a post-exposure reading operation on the detector unit of the semiconductor detector, wherein the post-exposure reading operation comprises charging the drain of the second transistor to a third voltage different than the second voltage;
comparing data of the pre-exposure reading operation with the post-exposure reading operation; and
adjusting an intensity of the light based on the compared data of the pre-exposure reading operation and the post-exposure reading operation.

16. The method of claim 15, wherein no power is applied to the first and second transistors during projecting the light of the exposure apparatus to the gate of the second transistor of the detector unit.

17. The method of claim 15, further comprising applying the first voltage to channels of the first and second transistors during applying the first voltage to the source of the first transistor.

18. The method of claim 15, wherein the second voltage is a ground voltage.

19. The method of claim 15, wherein applying the first and second voltages is such that electrons of the gate of the second transistor are in a saturation state.

20. The method of claim 15, further comprising exposing a product wafer by using the light after adjusting the intensity of the light.

* * * * *